United States Patent
Kawai et al.

(10) Patent No.: US 9,202,565 B2
(45) Date of Patent: *Dec. 1, 2015

(54) WRITE METHOD FOR WRITING TO VARIABLE RESISTANCE NONVOLATILE MEMORY ELEMENT AND VARIABLE RESISTANCE NONVOLATILE MEMORY DEVICE

(71) Applicant: Panasonic Intellectual Property Management Co., Ltd., Osaka (JP)

(72) Inventors: Ken Kawai, Osaka (JP); Kazuhiko Shimakawa, Osaka (JP); Yoshikazu Katoh, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 120 days.

This patent is subject to a terminal disclaimer.

(21) Appl. No.: 14/118,635

(22) PCT Filed: Mar. 13, 2013

(86) PCT No.: PCT/JP2013/001677
§ 371 (c)(1),
(2) Date: Nov. 19, 2013

(87) PCT Pub. No.: WO2013/140754
PCT Pub. Date: Sep. 26, 2013

(65) Prior Publication Data
US 2014/0185360 A1   Jul. 3, 2014

(30) Foreign Application Priority Data
Mar. 23, 2012 (JP) .................. 2012-068092

(51) Int. Cl.
*G11C 13/00* (2006.01)

(52) U.S. Cl.
CPC ........ *G11C 13/0069* (2013.01); *G11C 13/0007* (2013.01); *G11C 13/0011* (2013.01);
(Continued)

(58) Field of Classification Search
CPC .......... G11C 13/0069; G11C 13/0033; G11C 13/0007; G11C 13/0097; G11C 13/0011; G11C 2213/55; G11C 2013/0092
See application file for complete search history.

(56) References Cited

U.S. PATENT DOCUMENTS

| 8,022,502 B2 | 9/2011 | Kanzawa et al. |
| 8,338,816 B2 | 12/2012 | Kanzawa et al. |

(Continued)

FOREIGN PATENT DOCUMENTS

| JP | 2007-004849 | 1/2007 |
| JP | 2007-004935 | 1/2007 |

(Continued)

OTHER PUBLICATIONS

International Search Report issued Apr. 16, 2013 in International (PCT) Application No. PCT/JP2013/001677.

(Continued)

*Primary Examiner* — Vanthu Nguyen
*Assistant Examiner* — Jerome Leboeuf
(74) *Attorney, Agent, or Firm* — Wenderoth, Lind & Ponack, L.L.P.

(57) ABSTRACT

A write method for writing to a variable resistance nonvolatile memory element, comprising applying a set of strong recovery-voltage pulses at least once to the variable resistance nonvolatile memory element when it is determined that the resistance state of the variable resistance nonvolatile memory element fails to change to a second resistance state, remaining in a first resistance state, the set of strong recovery-voltage pulses including pulses: (1) a first strong recovery-voltage pulse which has a greater amplitude than a normal second voltage for changing the resistance state to the first resistance state, and has the same polarity as the second voltage; and (2) a second strong recovery-voltage pulse which follows the first strong recovery-voltage pulse and has a longer pulse width than the pulse width of the normal first voltage for changing the resistance state to the second resistance state, and has the same polarity as the first voltage.

16 Claims, 15 Drawing Sheets

(52) U.S. Cl.
CPC ........ *G11C13/0033* (2013.01); *G11C 13/0097* (2013.01); *G11C 2013/0092* (2013.01); *G11C 2213/55* (2013.01)

(56) References Cited

U.S. PATENT DOCUMENTS

| | | | |
|---|---|---|---|
| 8,345,465 | B2 | 1/2013 | Muraoka et al. |
| 8,445,319 | B2 | 5/2013 | Kanzawa et al. |
| 8,488,366 | B2 | 7/2013 | Kurosawa et al. |
| 8,514,607 | B2 | 8/2013 | Nakura et al. |
| 8,867,259 | B2 * | 10/2014 | Kawai et al. .................. 365/148 |
| 2009/0283736 | A1 | 11/2009 | Kanzawa et al. |
| 2010/0207094 | A1 | 8/2010 | Kanzawa et al. |
| 2010/0271860 | A1 | 10/2010 | Muraoka et al. |
| 2011/0222331 | A1 | 9/2011 | Kurosawa et al. |
| 2011/0294259 | A1 | 12/2011 | Kanzawa et al. |
| 2011/0299322 | A1 * | 12/2011 | Iijima et al. .................. 365/148 |
| 2012/0069633 | A1 * | 3/2012 | Katoh ........................... 365/148 |
| 2012/0075909 | A1 | 3/2012 | Nakura et al. |
| 2013/0044534 | A1 * | 2/2013 | Kawai et al. .................. 365/148 |
| 2013/0148408 | A1 * | 6/2013 | Kawai et al. .................. 365/148 |

FOREIGN PATENT DOCUMENTS

| | | |
|---|---|---|
| JP | 2009-104715 | 5/2009 |
| JP | 2011-187144 | 9/2011 |
| JP | 2012-069220 | 4/2012 |
| WO | 2008/149484 | 12/2008 |
| WO | 2009/050833 | 4/2009 |
| WO | 2009/145308 | 12/2009 |
| WO | 2010/038442 | 4/2010 |

OTHER PUBLICATIONS

I. G. Baek et al., "Highly Scalable Non-volatile Resistive Memory using Simple Binary Oxide Driven by Asymmetric Unipolar Voltage Pulses", 2004 IEEE International Electron Devices Meeting, IEDM Technical Digest, Dec. 13-15, 2004, p. 587.

* cited by examiner

FIG. 11

| Operation | Normal operation | | | By functional recovery of conductive path | | | By re-breakdown | | |
|---|---|---|---|---|---|---|---|---|---|
| | HR writing | LR writing | Normal read | First functional recovery | Second functional recovery | LR writing verify read | First re-breakdown | Second re-breakdown | Read after re-breakdown |
| WL | VL | VL | VDD | Vrch (> VH) | Vrcl | VDD | Vbrh (> Vrch) | Vbrl | VDD |
| SL | 0 V | VL | 0 V | 0 V | Vrcl | 0 V | 0 V | Vbrl | 0 V |
| BL | VH / 0 V | VL / 0 V | Vread | Vrch / 0 V | Vrcl / 0 V | Vread | Vbrh / 0 V | Vbrl / 0 V | Vread |

Voltage pulses to be applied

WRITE METHOD FOR WRITING TO VARIABLE RESISTANCE NONVOLATILE MEMORY ELEMENT AND VARIABLE RESISTANCE NONVOLATILE MEMORY DEVICE

TECHNICAL FIELD

The present invention relates to a write method for stably continuing resistance change of a variable resistance nonvolatile memory element a resistance value of which reversibly changes based on an electric signal, and a variable resistance nonvolatile memory device.

BACKGROUND ART

In recent years, there is on-going research and development of variable resistance nonvolatile memory devices (also simply referred to as a "nonvolatile memory device") which have a memory cell configured with a variable resistance nonvolatile memory element (Hereinafter, also simply referred to as a "variable resistance element") (for example, see Patent Literatures (PTLs) 1, 2, and 3 and Non-Patent Literature (NPL) 1).

Here, the variable resistance element refers to an element which has property that a resistance value reversibly changes depending on an electric signal, and additionally, is able to store data corresponding to the resistance value in a nonvolatile fashion.

CITATION LIST

Patent Literature

[PTL 1] Japanese Unexamined Patent Application Publication No. 2007-4935 (FIG. 1, FIG. 2)
[PTL 2] International Publication WO2008-149484
[PTL 3] International Publication WO2009-050833

Non Patent Literature

[NPL 1] I. G. Baek et al., IEDM2004, p. 587 ((b) of FIG. 5)

SUMMARY OF INVENTION

Technical Problem

The conventional technique mentioned above, however, has a problem that when one high resistance writing voltage pulse and one low resistance writing voltage pulse are repetitively and alternately applied to the variable resistance nonvolatile memory element, the variable resistance nonvolatile memory element stably performs resistance change operation at early stages of rewriting, while the resistance change state becomes unstable as the number of times the variable resistance element is rewritten increases.

The present invention is made to solve the above problem and has an object to provide a method for writing to a variable resistance nonvolatile memory element and a variable resistance nonvolatile memory device, which improve the unstable resistance change phenomenon conventionally encountered.

Solution to Problem

To achieve the above object, a write method for writing to a variable resistance nonvolatile memory element according to the present invention is a write method for writing to a variable resistance nonvolatile memory element for reversibly changing a resistance state of the variable resistance nonvolatile memory element by applying a voltage pulse to the variable resistance nonvolatile memory element, the variable resistance nonvolatile memory element including a first electrode, a second electrode, and a variable resistance layer between the first electrode and the second electrode, the variable resistance layer including a first transition metal oxide layer in contact with the first electrode, and a second transition metal oxide layer in contact with the second electrode, the second transition metal oxide layer having a smaller oxygen deficiency than the first transition metal oxide layer, the variable resistance nonvolatile memory element having characteristics of changing the resistance state from a first resistance state for use in recording first information to a second resistance state for use in recording second information when a pulse of a first voltage is applied to the variable resistance nonvolatile memory element, and changing the resistance state from the second resistance state to the first resistance state when a pulse of a second voltage that has a polarity different from the first voltage is applied to the variable resistance nonvolatile memory element, the write method including: (a) determining whether the resistance state of the variable resistance nonvolatile memory element fails to change to the second resistance state, remaining in the first resistance state when the pulse of the first voltage is applied to the variable resistance nonvolatile memory element; and (b) applying a set of strong recovery-voltage pulses at least once to the variable resistance nonvolatile memory element when it is determined in step (a) that the resistance state of the variable resistance nonvolatile memory element fails to change to the second resistance state, remaining in the first resistance state, the set of strong recovery-voltage pulses including two pulses which are: a first strong recovery-voltage pulse having a greater amplitude than the second voltage and a same polarity as the second voltage; and a second strong recovery-voltage pulse which follows the first strong recovery-voltage pulse and has a longer pulse width than a pulse width of the first voltage and a same polarity as the first voltage.

It should be noted that the present invention can be implemented in not only such a write method for writing to a variable resistance nonvolatile memory element, but also a variable resistance nonvolatile memory device which includes a drive circuit that executes such a write method.

Advantageous Effects of Invention

According to the write method for writing to the variable resistance nonvolatile memory element and the variable resistance nonvolatile memory device of the present invention, even if the number of write times increases, a suitable operating window can be ensured, and as a result, the resistance change operation can be stably continued, and the reliability of the nonvolatile memory device can be improved significantly.

BRIEF DESCRIPTION OF DRAWINGS

FIG. 11 is a diagram for illustrating set voltages in each operation according to the embodiment of the present invention.

DESCRIPTION OF EMBODIMENTS

First, before describing an embodiment of the present invention, the subject of the present invention will be described in detail.

BACKGROUND OF THE INVENTION

Conventionally, nonvolatile memory devices in which memory cells are arrayed in a matrix form are generally known as nonvolatile memory devices which include variable resistance elements. The memory cell is a so-called 1T1R, wherein an MOS transistor and a variable resistance element are connected in series near an intersection of a bit line and a word line which are arranged perpendicular to each other. In the 1T1R, one of two terminals of a variable resistance element is connected to a bit line or a source line, and the other is connected to the drain or the source of a transistor. The gate of the transistor is connected to a word line. The other end of the transistor is connected to the source line or the bit line (i.e., the source line or the bit line to which the one end of the variable resistance element is not connected). The source line is disposed in parallel with the bit line or the word line.

Nonvolatile memory devices in which crosspoint memory cells are arrayed in a matrix form are generally known as another memory cell configuration. The crosspoint memory cell is a so-called 1D1R type, wherein a diode and a variable resistance element are connected in series near an intersection of a bit line and a word line disposed perpendicular to each other.

Hereinafter, a typical conventional variable resistance element will be described.

NPL 1 discloses a nonvolatile memory which includes a 1T1R memory cell which uses a transition metal oxide for a variable resistance element. A thin film of the transition metal oxide is typically an insulator. It is shown that to allow a resistance value of the thin film of the transition metal oxide to vary by application of an electrical pulse, a forming process needs to be performed to form a conductive path which allows for switching a high resistance state and a low resistance state.

Figure 15:
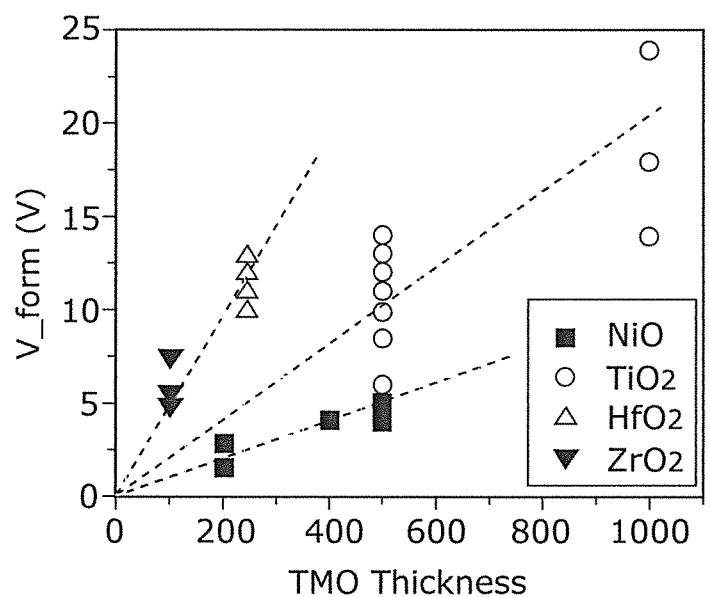
FIG. 15 is a graph showing the dependence of a forming voltage on the film thickness of a transition metal oxide in a conventional variable resistance nonvolatile memory element.

FIG. 15 is a graph showing the dependence of a forming voltage (V_form) shown in NPL 1 on the film thickness (TMO Thickness) of the transition metal oxide. The characteristics of four types of transition metal oxides, NiO, $TiO_2$, $HfO_2$, and $ZrO_2$, are shown. A required forming voltage depends on the type of transition metal oxide, and increases as the film thickness of the transition metal oxide increases. Therefore, to reduce the forming voltage, preferably, a transition metal oxide like NiO is selected and the film thickness of the transition metal oxide is thinned. Forming refers to applying a greater voltage than a voltage in the normal operation to a variable resistance element to change the state of the manufactured variable resistance element into a state (normal operation) where the resistance value of the variable resistance element can change reversibly based on an electric signal.

PTL 1 discloses a nonvolatile memory which includes an ionic-conduction variable resistance element which includes an insulator film (amorphous $Gd_2O_3$) and a conductor film (CuTe).

Figure 16:
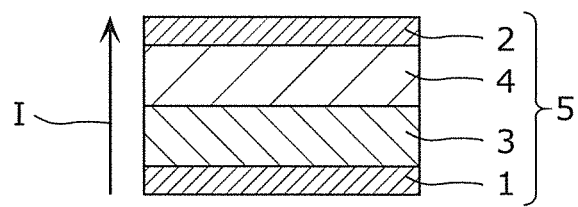
FIG. 16 is a schematic view of a cross section of a conventional variable resistance element.

FIG. 16 is a schematic view of a cross section of the variable resistance element 5 disclosed in PTL 1.

The variable resistance element 5 has a stacked structure including a conductor film 3 and an insulator film 4 between two electrodes 1 and 2. A metal film, an alloy film (for example, CuTe alloy film), a metallic-compounds film, and the like which contain one or more metallic elements selected from among, for example, Cu, Ag, and Zn are disclosed as a material for use in the conductor film 3. Insulators such as $SiO_2$ and amorphous $Gd_2O_3$ are disclosed as materials of the insulator film 4.

In writing to the variable resistance element 5 shown in FIG. 16, when a voltage is applied so that the potential of the electrode 1 is higher than the potential of the electrode 2, ions of metallic elements are attracted to the electrode 2 and the ions of metallic elements enter the insulator film 4. Then, once the ions reach the electrode 2, there is conduction between the top and bottom electrodes 1 and 2, thereby changing the resistance state of the variable resistance element 5 to a low resistance state (LR writing). The data write to the variable resistance element 5 (LR writing) is thus performed. In contrast, when a voltage is applied so that the potential of the electrode 1 is lower than the potential of the electrode 2, the metallic elements are ionized and attracted to the electrode 1, escaping from the insulator film 4. Thus, insulation between the top and bottom electrodes 1 and 2 increases, thereby changing the resistance state of the variable resistance element 5 to a high resistance state (HR writing). The data erase from the variable resistance element 5 (LR writing) is thus performed.

Figure 17:
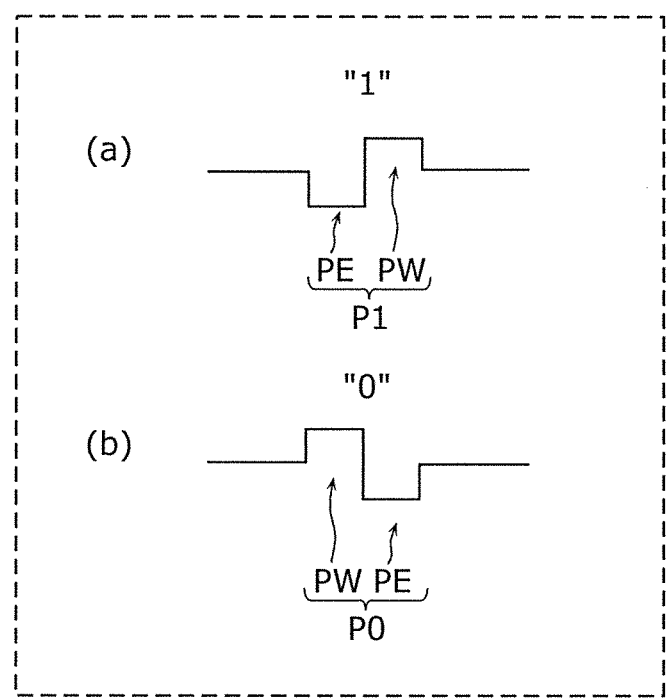
FIG. 17 Part (a) of FIG. 17 is a waveform chart of a pulse when write operation is performed by conventional technology, and (b) of FIG. 17 is a waveform chart of a pulse when erase operation is performed by the conventional technology.

Parts (a) and (b) of FIG. 17 are waveform charts of voltage pulses applied to the variable resistance element 5, for performing one data recording.

Part (a) of FIG. 17 shows a pulse waveform in writing (recording data "1"). Here, an erase voltage pulse PE is first applied as a voltage pulse having an opposite polarity, and, subsequently, a voltage pulse PW having a polarity corresponding to information to be recorded is applied to the variable resistance element 5. In other words, a set of two voltage pulses PE and PW forms a voltage pulse P1 which records information "1."

Part (b) of FIG. 17 is a pulse waveform in erasing (recording data "0"). Here, the write voltage pulse PW is first applied as the voltage pulse having an opposite polarity, and, subsequently, the voltage pulse PE having a polarity corresponding to information to be recorded is applied to the variable resistance element 5. In other words, a set of two voltage pulses PW and PE forms a voltage pulse P0 which records information "0."

The number of times the voltage pulse PW or PE having the same polarity continues is restricted to twice or less by recording data onto the variable resistance element 5 by using the voltage pulses P1 and P0 shown in (a) and (b) of FIG. 17, respectively. This can inhibit the resistance value of the variable resistance element 5 from changing (failure that the LR state varies toward the high resistance state, the failure that the HR state varies toward the low resistance state) due to a fact that the voltage pulse PW or PE having the same polarity is continuously applied a large number of times. Thus, a rewriting lifetime of the variable resistance element is extended.

Here, in summary of the disclosure in the background art, NPL 1 discloses that some of transition metal oxides show a reversible and nonvolatile resistance change phenomenon by application of an electric pulse, and that to generate a state in which the resistance change phenomenon may occur, it is necessary to previously apply a voltage an absolute value of which is greater than a voltage that is to be applied for causing the reversible resistance change once the state is generated. It should be noted that consistently herein, an operation (operation including the above-mentioned forming) of applying such voltages will be referred to as an initial breakdown, and a voltage applied by the initial breakdown will be referred to as an initial breakdown voltage.

NPL 1 discloses that a mechanism for the initial breakdown can be described by a model which forms a conductive path that allows for a reversible resistance change of a transition metal oxide in an extremely high resistance state close to the initial insulating state.

PTL 1 discloses a data record method which provides an extended rewriting lifetime of a variable resistance element by applying a voltage having one polarity to the variable resistance element before applying to the variable resistance element a voltage having the other polarity corresponding to information to be recorded.

Then, it is expected that by using such a variable resistance element as a memory cell, a higher-speed memory than generally-known nonvolatile memories such as a flash memory can be configured.

[Finding by the Inventors]

Among variable resistance nonvolatile memory devices, the inventors are considering, based on the above-mentioned disclosure, a variable resistance nonvolatile memory device which includes a memory cell configured with a switching element and a variable resistance layer comprising oxygen-deficient oxide (for example, tantalum oxide) of tantalum (Ta) which is one of transition metals.

Here, the oxygen-deficient oxide refers to an oxide of oxygen-deficient in stoichiometric composition.

In preparation for setting forth a problem, description will be given regarding some characteristics obtained from an experiment with respect to the variable resistance element which includes a variable resistance layer comprising oxygen-deficient Ta oxide (TaO$_x$ where 0<x<2.5). The details are disclosed in PTLs 2 and 3 which are related patent applications.

Figure 18:
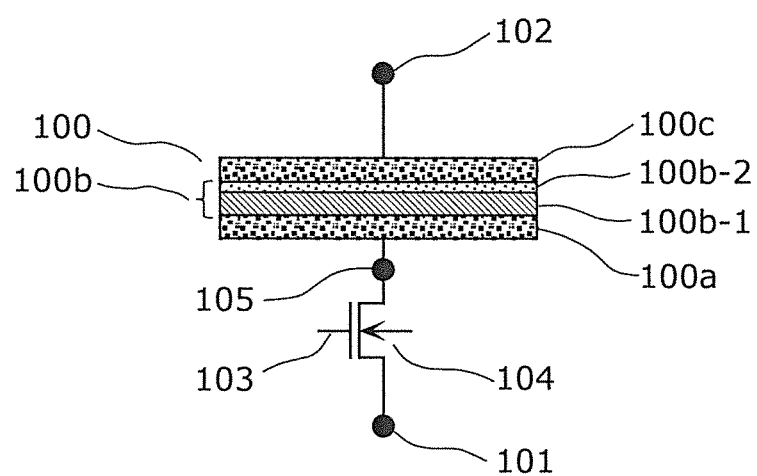
FIG. 18 is a schematic view showing the configuration of a 1T1R memory cell which includes the conventional variable resistance element.

FIG. 18 is a schematic view showing the configuration (configuration of one bit) of a 1T1R memory cell which includes a conventional variable resistance element. As shown in FIG. 18, the 1T1R memory cell, typically, includes an NMOS transistor 104 and a variable resistance element 100.

As shown in FIG. 18, the variable resistance element 100 is an element formed of a bottom electrode 100a, a variable resistance layer 100b, and a top electrode 100c in stack. The variable resistance layer 100b is formed of a low-resistance first transition metal oxide layer comprising an oxygen-deficient transition metal oxide (here, a first tantalum oxide layer (TaO$_x$ where 0<x<2.5)) 100b-1 and a high-resistance second transition metal oxide layer (here a second tantalum oxide layer (TaO$_y$ where x<y)) 100b-2 in stack. A bottom electrode terminal 105 is pulled out from the bottom electrode 100a, and a top electrode terminal 102 is pulled out from the top electrode 100c.

The NMOS transistor 104 which is a selection transistor (i.e., by way of example of the switching element) includes a gate terminal 103. The bottom electrode terminal 105 of the variable resistance element 100 and a source or drain (N$^+$ diffusion) region of the NMOS transistor 104 are connected in series. The other of the drain or source (N$^+$ diffusion) region that is not connected to the variable resistance element 100 is pulled out as a bottom electrode terminal 101. A substrate terminal of the NMOS transistor 104 is connected to ground potential. Here, the high-resistance second transition metal oxide layer 100b-2 is disposed to the side of the top electrode terminal 102 which is on the opposite side of the NMOS transistor 104.

Here, as a material of the top electrode 100c, for example, Pt (platinum), Ir (iridium), Pd (palladium), Ag (silver), Ni (nickel), W (tungsten), Cu (copper), or the like can be used as disclosed in the above-mentioned PTL 3 which is a related application.

PTL 3 discloses that a resistance change of the variable resistance layer 100b near an interface with the top electrode 100c is likely to occur when the top electrode 100c comprises an electrode material that has standard electrode potential higher than Ta which is a component element of the variable resistance layer 100b and the resistance change is unlikely to occur when the top electrode 100c comprises an electrode material that has standard electrode potential lower than Ta, and also, that the resistance change is more likely to occur as a difference in the standard electrode potential between the electrode material included in the top electrode 100c and a metal included the variable resistance layer 100b increases and the resistance change is less likely to occur as the difference decreases.

It should be noted that the standard electrode potential generally is an indicator of oxidation resistance, indicating that the greater the value is the more the oxidization is likely to occur and the smaller the value is the less the oxidization is likely to occur. In particular, preferably, the electrode comprises Pt, Ir, or the like which has high standard electrode potential for favorable resistance change operation.

In the memory cell shown in FIG. 18, when a voltage (low resistance writing voltage pulse) greater than or equal to a positive given voltage (for example, a first threshold voltage) relative to the top electrode terminal 102 is applied to the bottom electrode terminal 101, reduction reaction occurs near the interface with the top electrode 100c in the variable resistance layer 100b, and the resistance state of the variable resistance element 100 changes to the low resistance state. On the other hand, when a voltage (high resistance writing voltage pulse) greater than or equal to another positive given voltage (for example, a second threshold voltage) relative to the bottom electrode terminal 101 is applied to the top electrode terminal 102, oxidization occurs near the interface with the top electrode 100c in the variable resistance layer 100b, and the resistance state of the variable resistance element 100 changes to the high resistance state. Here, a direction in which the low resistance writing voltage pulse is applied is defined as a negative voltage direction, and a direction in which the high resistance writing voltage pulse is applied is defined as a positive voltage direction.

There is, however, a problem with the memory cell, which includes the variable resistance element described above, that when the high resistance writing voltage pulse (once) and the low resistance writing voltage pulse (once) are repetitively and alternately applied, as the number of write times increases the more unstable the resistance change state is, in spite of stable resistance change operation in early stages of rewriting.

Thus, through intensive studies to solve the above problem, the inventors have found a write method for writing to a variable resistance nonvolatile memory element and a variable resistance nonvolatile memory device as described below.

Specifically, one aspect of a write method for writing to the variable resistance nonvolatile memory element according to the present invention, which solves the above problem, is a write method for writing to a variable resistance nonvolatile memory element for reversibly changing a resistance state of the variable resistance nonvolatile memory element by applying a voltage pulse to the variable resistance nonvolatile memory element, the variable resistance nonvolatile memory element including a first electrode, a second electrode, and a variable resistance layer between the first electrode and the second electrode, the variable resistance layer including a first transition metal oxide layer in contact with the first electrode, and a second transition metal oxide layer in contact with the second electrode, the second transition metal oxide layer having a smaller oxygen deficiency than the first transition metal oxide layer, the variable resistance nonvolatile memory element having characteristics of changing the resistance state from a first resistance state for use in recording first information to a second resistance state for use in recording second information when a pulse of a first voltage is applied to the variable resistance nonvolatile memory element, and changing the resistance state from the second resistance state to the first resistance state when a pulse of a second voltage that has a polarity different from the first voltage is applied to the variable resistance nonvolatile memory element, the write method including: (a) determining whether the resistance state of the variable resistance nonvolatile memory element fails to change to the second resistance state, remaining in the first resistance state when the pulse of the first voltage is applied to the variable resistance nonvolatile memory element; and (b) applying a set of strong recovery-voltage pulses at least once to the variable resistance nonvolatile memory element when it is determined in step (a) that the resistance state of the variable resistance nonvolatile memory element fails to change to the second resistance state, remaining in the first resistance state, the set of strong recovery-voltage pulses including two pulses which are: a first strong recovery-voltage pulse having a greater amplitude than the second voltage and a same polarity as the second voltage; and a second strong recovery-voltage pulse which follows the first strong recovery-voltage pulse and has a longer pulse width than a pulse width of the first voltage and a same polarity as the first voltage.

According to the above configuration, even if the failure in resistance change, such as the "held HR state", has occurred, a set of strong recovery-voltage pulses is applied at least once to the variable resistance nonvolatile memory element, thereby solving such failure. Thus, even if the number of write times increases, it is possible to ensure a suitable operating window, and as a result, the resistance change operation can stably continue, and the reliability of the nonvolatile memory device can be improved significantly.

Here, the write method may further include (c) applying, prior to step (b), a set of preliminary recovery voltage pulses at least once to the variable resistance nonvolatile memory element when it is determined in step (a) that the resistance state of the variable resistance nonvolatile memory element fails to change to the second resistance state, remaining in the first resistance state, the set of preliminary recovery voltage pulses including two pulses which are: a first preliminary recovery-voltage pulse having a greater amplitude than the second voltage and a same polarity as the second voltage; and a second preliminary recovery-voltage pulse which follows the first preliminary recovery-voltage pulse and has a same polarity as the first voltage, wherein the set of strong recovery-voltage pulses is applied at least once to the variable resistance nonvolatile memory element in step (b) when the resistance state of the variable resistance nonvolatile memory element fails to change to the second resistance state after step (c). According to the above configuration, the set of preliminary recovery voltage pulses is applied to the variable resistance nonvolatile memory element, prior to the application of the set of strong recovery-voltage pulses. Thus, the possibility of solving the failure in resistance change, such as the "held HR state", increases.

Moreover, the first preliminary recovery-voltage pulse and the first strong recovery-voltage pulse may be equal in amplitude. According to the above configuration, since the first preliminary recovery-voltage pulse and the first strong recovery-voltage pulse are equal in amplitude, a single circuit may generate these pulses.

Moreover, the write method may further include (d) determining whether the resistance state of the variable resistance nonvolatile memory element has changed to the second resistance state by the application of the second strong recovery-voltage pulse, wherein step (b) and step (d) are repeated until the resistance state of the variable resistance nonvolatile memory element reaches the second resistance state. According to the above configuration, step (b) is repeated until the failure in resistance change is solved. Thus, the failure in resistance change, such as the "held HR state," can be successfully solved.

Moreover, when the resistance state of the variable resistance nonvolatile memory element does not change to the second resistance state after step (b) and step (d) are repeated a predetermined number of times, the second strong recovery-voltage pulse may be changed to a new second strong recovery-voltage pulse that has a longer pulse width than the second strong recovery-voltage pulse, and step (b) and step (d) may be repeated a predetermined number of times. According to the above configuration, the pulse width of the second strong recovery-voltage pulse is increased until the failure in resistance change is solved. Thus, the failure in resistance change, such as a stronger "held HR state" can be solved.

It should be noted that as the material of the variable resistance nonvolatile memory element, the first transition metal oxide layer may comprise a composition represented by $TaO_x$, and the second transition metal oxide layer may comprise a composition represented by $TaO_y$, where $x<y$. Moreover, as an example of the failure in resistance change, the variable resistance nonvolatile memory element may be an element, a resistance state of which reversibly changes between a high resistance state and a low resistance state, the high resistance state being the first resistance state, the low resistance state being the second resistance state.

Moreover, to solve the above problem, one aspect of a variable resistance nonvolatile memory device according to the present invention is a variable resistance nonvolatile memory device including: a memory cell in which a variable resistance nonvolatile memory element and a switching element are connected in series; and a drive circuit for driving the memory cell, the variable resistance nonvolatile memory element including a first electrode, a second electrode, and a variable resistance layer between the first electrode and the second electrode, the variable resistance layer including a first transition metal oxide layer in contact with the first electrode, and a second transition metal oxide layer in contact with the second electrode, the second transition metal oxide layer having a smaller oxygen deficiency than the first transition metal oxide layer, the variable resistance nonvolatile memory element having characteristics of changing a resistance state from a first resistance state for use in recording first information to a second resistance state for use in recording second information when a pulse of a first voltage is applied to the variable resistance nonvolatile memory element, and changing the resistance state from the second resistance state to the first resistance state when a pulse of a second voltage having a polarity different from the first voltage is applied to the variable resistance nonvolatile memory element, the drive circuit including: a write circuit for writing to the memory cell; a sense amplifier for reading from the memory cell; and a control circuit for executing, using the sense amplifier, (a) determining whether the resistance state of the variable resistance nonvolatile memory element fails to change to the second resistance state, remaining in the first resistance state when the write circuit applies the pulse of the first voltage to the variable resistance nonvolatile memory element, wherein when it is determined in step (a) that the resistance state of the variable resistance nonvolatile memory element fails to change to the second resistance state, remaining in the first resistance state, the control circuit controls the write circuit to execute (b) applying a set of strong recovery-voltage pulses at least once to the variable resistance nonvolatile memory element, the set of strong recovery-voltage pulses including two pulses which are: a first strong recovery-voltage pulse having a greater amplitude than the second voltage and a same polarity as the second voltage; and a second strong recovery-voltage pulse which follows the first strong recovery-voltage pulse, and has a longer pulse width than a pulse width of the first voltage and a same polarity as the first voltage.

According to the above configuration, even if the failure in resistance change, such as the "held HR state", has occurred, a set of strong recovery-voltage pulses is applied at least once to the variable resistance nonvolatile memory element, thereby solving such failure. Thus, even if the number of write times increases, it is possible to ensure a suitable operating window, and as a result, the resistance change operation can stably continue, and the reliability of the nonvolatile memory device can be improved significantly.

Here, when it is determined in step (a) that the resistance state of the variable resistance nonvolatile memory element fails to change to the second resistance state, remaining in the first resistance state, the control circuit may further control the write circuit to execute, prior to step (b), (c) applying a set of preliminary recovery voltage pulses at least once to the variable resistance nonvolatile memory element, the set of preliminary recovery voltage pulses including two pulses which are: a first preliminary recovery-voltage pulse having a greater amplitude than the second voltage and a same polarity as the second voltage; and a second preliminary recovery-voltage pulse which follows the first preliminary recovery-voltage pulse and has a same polarity as the first voltage, and the control circuit controls the write circuit to execute step (b) when the resistance state of the variable resistance nonvolatile memory element fails to change to the second resistance state after step (c). According to the above configuration, the set of preliminary recovery voltage pulses is applied to the variable resistance nonvolatile memory element, prior to the application of the set of strong recovery-voltage pulses. Thus, the possibility of solving the failure in resistance change, such as the "held HR state", increases.

Moreover, the first preliminary recovery-voltage pulse and the first strong recovery-voltage pulse may be equal in amplitude. According to the above configuration, since the first preliminary recovery-voltage pulse and the first strong recovery-voltage pulse are equal in amplitude, a single circuit may generate these pulses.

Moreover, the control circuit may further execute, using the sense amplifier, (d) determining whether the resistance state of the variable resistance nonvolatile memory element has changed to the second resistance state by the application of the second strong recovery-voltage pulse, and the control circuit may control the write circuit and the sense amplifier so that step (b) and step (d) are repeated until the resistance state of the variable resistance nonvolatile memory element reaches the second resistance state. According to the above configuration, step (b) is repeated until the failure in resistance change is solved. Thus, the failure in resistance change, such as the "held HR state," can be successfully solved.

Moreover, when the resistance state of the variable resistance nonvolatile memory element does not change to the second resistance state after step (b) and step (d) are repeated a predetermined number of times, the control circuit may control the write circuit and the sense amplifier so that the second strong recovery-voltage pulse is changed to a new second strong recovery-voltage pulse that has a longer pulse width than the second strong recovery-voltage pulse and step (b) and step (d) are repeated a predetermined number of times. According to the above configuration, the pulse width of the second strong recovery-voltage pulse is increased until the failure in resistance change is solved. Thus, the failure in resistance change, such as a stronger "held HR state" can be solved.

It should be noted that as the material of the variable resistance nonvolatile memory element, the first transition metal oxide layer may comprise a composition represented by $TaO_x$, and the second transition metal oxide layer may comprise a composition represented by $TaO_y$, where $x<y$. Moreover, as a configuration example of the memory cell, the switching element may be an MOS transistor, or may be a bidirectional diode. Furthermore, as an example of the failure in resistance state, the variable resistance nonvolatile memory element may be an element, a resistance state of which reversibly changes between a high resistance state and a low resistance state, the high resistance state being the first resistance state, the low resistance state being the second resistance state.

DETAILED DESCRIPTION OF SUBJECT OF THE PRESENT INVENTION

Here, more details of the subject of the present invention will be described.

First, resistance change characteristics of a 1T1R memory cell as shown in FIG. 18 will be given, and a subject thereof will be described in detail. The 1T1R memory cell is configured with the variable resistance element 100 which includes: the top electrode 100c comprising Ir (iridium); the bottom electrode 100a comprising TaN (tantalum nitride); and a variable resistance layer including the first transition metal oxide layer (here, the first tantalum oxide layer ($TaO_x$ where $0<x<2.5$)) 100b-1 and the second transition metal oxide layer (here, the second tantalum oxide layer ($TaO_y$ where $x<y$)) 100b-2.

A sample used for experiment herein is the variable resistance layer 100b which has an area of $0.25\ \mu m^2$ (=$0.5\ \mu m \times 0.5\ \mu m$), and includes the first transition metal oxide layer 100b-1 (here, $TaO_x$:$x=1.54$, film thickness: 30 nm) in contact with the bottom electrode 100a, and the second transition metal oxide layer 100b-2 (here, $TaO_y$:$y=2.47$, film thickness: 6.5 nm) in contact with the top electrode 100c. The NMOS transistor 104 which is the switching element has the gate width W: 0.44 μm, the gate length L: 0.18 μm, and the film thickness $To_x$ of gate insulating film: 3.5 nm.

Before the fabrication step of the top electrode 100c, the second transition metal oxide layer 100b-2 (here, $TaO_y$) is deposited, by sputtering, on the first transition metal oxide layer 100b-1 (here, $TaO_x$) deposited by sputtering. The second transition metal oxide layer 100b-2 has small oxygen deficiency compared to the first transition metal oxide layer 100b-1 (here, $TaO_x$), that is, has a structure where the resistance value is extremely high (greater than 1 MΩ). To carry out the resistance change operation, it is required to first apply the initial breakdown voltage for a predetermined period to the variable resistance layer 100b to form a conductive path in the second transition metal oxide layer 100b-2.

The variable resistance layer 100b is between the bottom electrode 100a and the top electrode 100c, the resistance value of which reversibly changes based on an electrical signal given between the bottom electrode 100a and the top electrode 100c. For example, the resistance state of the variable resistance layer 100b reversibly changes between a high resistance state and a low resistance state, in accordance with the polarity of a voltage given between the bottom electrode 100a and the top electrode 100c. The variable resistance layer 100b has a stacked structure in which at least two layers are stacked which are a first variable resistance layer (here, the first transition metal oxide layer 100b-1) connected to the bottom electrode 100a and a second variable resistance layer (here, the second transition metal oxide layer 100b-2) connected to the top electrode 100c.

The first variable resistance layer comprises a first metal oxide of oxygen-deficient, and the second variable resistance layer comprises a second metal oxide that has smaller oxygen deficiency than the first metal oxide. A micro local region where the oxygen deficiency reversibly changes in accordance with application of an electrical pulse is formed in the second variable resistance layer of the variable resistance element 100. The local region is considered including filaments formed of oxygen defect sites.

"Oxygen deficiency" refers to a percentage of deficiency of oxygen in a metal oxide relative to an amount of oxygen included in an oxide which has the stoichiometric composition (if there is a plurality of stoichiometric compositions, a stoichiometric composition in which the resistance value is the highest). Metal oxides having stoichiometric compositions are more stable and have higher resistance values than metal oxides that have other compositions.

For example, when the metal is tantalum (Ta), an oxide which has a stoichiometric composition by the above definition is represented by $Ta_2O_5$, and thus can be represented by $TaO_{2.5}$. The oxygen deficiency in $TaO_{2.5}$ is 0%, and the oxygen deficiency in $TaO_{1.5}$ is as follows: oxygen deficiency= $(2.5-1.5)/2.5=40\%$. A metal oxide comprising excessive oxygen has oxygen deficiency of a negative value. It should be noted that, unless otherwise indicated herein, description will be given assuming that the oxygen deficiency includes positive values, zero, and negative values.

An oxide having small oxygen deficiency has a high resistance value because the oxide is closer to an oxide that has a stoichiometric composition. An oxide having large oxygen deficiency has a low resistance value because the oxide is closer to a metal included in an oxide.

"Oxygen content percentage" is a percentage of the number of oxygen atoms relative to the total number of atoms. For example, an oxygen content percentage of $Ta_2O_5$ is a percentage of the number of oxygen atoms relative to the total number of atoms (O/(Ta+O)), and 71.4 atm %. Thus, an oxygen content percentage of an oxygen-deficient tantalum oxide is greater than 0 atm % and less than 71.4 atm %. For example, when a metal included in the first metal oxide layer and a metal included in the second metal oxide layer are the same, the oxygen content percentage corresponds to the oxygen deficiency. In other words, when the oxygen content percentage of the second metal oxide is greater than the oxygen content percentage of the first metal oxide, the oxygen deficiency in the second metal oxide is smaller than the oxygen deficiency in the first metal oxide.

The metal included in the variable resistance layer 100b may be other than tantalum. Examples of the metal included in the variable resistance layer 100b include a transition metal and aluminum (Al). Examples of the transition metal include tantalum (Ta), titanium (Ti), hafnium (Hf), zirconium (Zr), niobium (Nb), tungsten (W), and nickel (Ni). Transition metals can adopt multiple oxidization states, and thus different resistance states can be achieved by redox reaction.

For example, when a hafnium oxide is used, the resistance value of the variable resistance layer 100b can be stably and rapidly changed when a composition of the first metal oxide is represented by $HfO_x$ where x is 0.9 or greater and 1.6 or less and a composition of the second metal oxide is represented by $HfO_y$ where a value of y is greater than a value of x. In this case, the film thickness of the second metal oxide may be 3 to 4 nm.

When a zirconium oxide is used, the resistance value of the variable resistance layer 100b can be stably and rapidly changed when a composition of the first metal oxide is represented by $ZrO_x$ where x is 0.9 or greater and 1.4 or less and a composition of the second metal oxide is represented by $ZrO_y$ where a value of y is greater than a value of x. In this case, the film thickness of the second metal oxide may be 1 to 5 nm.

A first metal included in the first metal oxide and a second metal included in the second metal oxide may be different metals. In this case, the second metal oxide may have smaller oxygen deficiency, namely, higher resistance than the first metal oxide. Such a configuration allows the voltage applied between the bottom electrode 100a and the top electrode 100c for resistance change to be distributed greater to the second metal oxide than to the first metal oxide. This facilitates the redox reaction in the second metal oxide.

If the first metal included in the first metal oxide to be the first variable resistance layer and the second metal included in the second metal oxide to be the second variable resistance layer comprise different materials, the standard electrode potential of the second metal may be lower than the standard electrode potential of the first metal. The standard electrode potential represents a characteristic in which the higher the value of the standard electrode potential is the greater resistant the metal has to oxidization. This facilitates the redox reaction in the second metal oxide the standard electrode potential of which is relatively low. In the resistance change phenomenon, the resistance value (oxygen deficiency) of the second metal oxide is believed to change due to a fact that the filament (conductive path) is altered by the occurrence of the redox reaction in the micro local region formed in the second metal oxide that is highly resistive.

For example, by using the oxygen-deficient tantalum oxide ($TaO_x$) for the first metal oxide and a titanium oxide ($TiO_2$) for the second metal oxide, stable resistance change operation is obtained. Titanium (standard electrode potential=−1.63 eV) is a material that has a lower standard electrode potential than tantalum (standard electrode potential=−0.6 eV). As described above, by using a metal oxide that has lower standard electrode potential than the first metal oxide for the second metal oxide, the redox reaction in the second metal oxide is more facilitated. As another combination, an aluminum oxide ($Al_2O_3$) can be used for the second metal oxide to be a high resistance layer. For example, an oxygen-deficient tantalum oxide ($TaO_x$) may be used for the first metal oxide and an aluminum oxide ($Al_2O_3$) may be used for the second metal oxide.

In any of the resistance change phenomenon in the variable resistance layer which has the stacked structure, the resistance value of the second metal oxide is believed to change because the filament (conductive path) in the micro local region is altered by the occurrence of the redox reaction in the micro local region formed in the second metal oxide that is highly resistive.

Specifically, when a positive voltage relative to the bottom electrode 100a is applied to the top electrode 100c connected to the second metal oxide, oxygen ions in the variable resistance layer 100b are attracted to the second metal oxide. This causes oxidization reaction in the micro local region formed in the second metal oxide and the oxygen deficiency in the second metal oxide reduces. It is believed that, as a result, the filament is hardly formed in the local region, which increases the resistance value of the second metal oxide.

Conversely, when a negative voltage relative to the bottom electrode 100a is applied to the top electrode 100c connected to the second metal oxide, oxygen ions in the second metal oxide are pushed toward the first metal oxide. This causes reduction reaction in the micro local region formed in the second metal oxide layer and the oxygen deficiency in the second metal oxide increases. It is believed that, as a result, the filament is likely to be formed in the local region, which decreases the resistance value of the second metal oxide.

The top electrode 100c connected to the second metal oxide the oxygen deficiency of which is smaller than the first metal oxide comprises a material, such as platinum (Pt), iridium (Ir), and palladium (Pd), that has higher standard electrode potential than the metal included in the second metal oxide and the material included in the bottom electrode 100a. Moreover, the bottom electrode 100a connected to the first metal oxide the oxygen deficiency of which is higher than the second metal oxide may comprise a material, such as tungsten (W), nickel (Ni), tantalum (Ta), titanium (Ti), aluminum (Al), tantalum nitride (TaN), and titanium nitride (TiN) that has lower standard electrode potential than the metal included in the first metal oxide. The standard electrode potential represents a characteristic in which the higher the value of the standard electrode potential is the greater resistant the metal has to oxidization.

In other words, the relationship between standard electrode potential V2 of the second electrode, standard electrode potential Vr2 of the metal included in the second metal oxide, standard electrode potential Vr1 of the metal included in the first metal oxide, and standard electrode potential V1 of the first electrode may satisfy Vr2<V2 and V1<V2. Furthermore, V2>Vr2 and Vr1≥V1 may be satisfied.

According to the above configuration, the redox reaction selectively occurs in the second metal oxide near an interface between the top electrode 100c and the second metal oxide, and stable resistance change phenomenon is obtained.

To drive the nonvolatile memory element 100 configured as described above, a voltage satisfying predetermined conditions is applied between the bottom electrode 100a and the top electrode 100c by an external power source.

Figure 1:
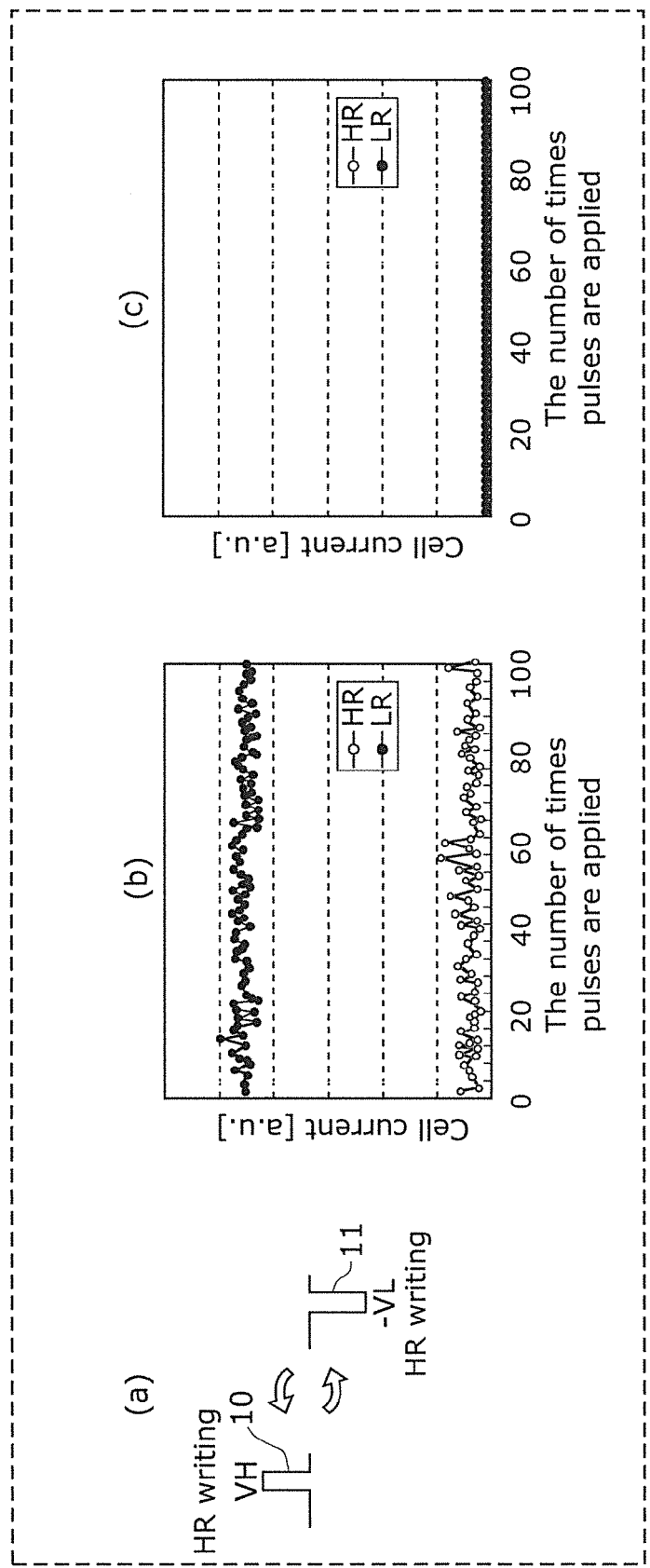
FIG. 1 Part (a) of FIG. 1 is a schematic view of a pulse waveform when a high resistance (HR) writing voltage pulse (one pulse) and a low resistance (LR) writing voltage pulse (one pulse) are repetitively and alternately applied to a variable resistance nonvolatile memory element, (b) of FIG. 1 is a diagram showing normal resistance change characteristics when the high resistance writing voltage pulse and the low resistance writing voltage pulse shown in (a) of FIG. 1 are repetitively and alternately applied to the variable resistance nonvolatile memory element, and (c) of FIG. 1 is a diagram showing abnormal resistance change characteristics when the failure, a "held high resistance (HR) state", occurs.

An example of normal resistance change characteristics of the 1T1R memory cell which includes the variable resistance element of the FIG. 18 thus configured is shown in (b) of FIG. 1, where a high resistance (HR) writing voltage pulse 10 (voltage is VH) shown in (a) of FIG. 1 and a low resistance (LR) writing voltage pulse 11 (voltage is −VL) are repetitively and alternately applied multiple times between the bottom electrode terminal 101 and the top electrode terminal 102. An example of abnormal resistance change characteristics when failure, the "held high resistance (HR) state" has occurred is shown in (c) of FIG. 1. It should be noted that the "held high resistance (HR) state" is a phenomenon (failure) in which the resistance state of the variable resistance element in the HR state does not change to the low resistance (LR) state (maintained in the HR state) although an LR writing voltage pulse is applied to the variable resistance element.

Here, a voltage value of a voltage pulse is represented by a sign after the voltage pulse. Hereinafter, the voltage value of the voltage pulse is notated in the same manner as appropriate. Terms, high resistance and low resistance, may be abbreviated as HR and LR, respectively, unless otherwise its clarity is lost. In (a) of FIG. 1, the high resistance (HR) writing voltage pulse 10 and the low resistance (LR) writing voltage pulse 11 are abbreviated as HR writing and LR writing, respectively.

It is regarded that application of a positive voltage, relative to the bottom electrode terminal 101, to the top electrode terminal 102 is positive voltage application, and the reverse case be negative voltage application. At the applications of both the HR writing voltage pulse 10 (voltage is VH) and the LR writing voltage pulse 11 (voltage is −VL), the gate terminal 103 of the NMOS transistor 104 is applied with, for example, a positive gate voltage VL that is equal to the LR writing voltage pulse 11 in absolute value, so that the NMOS transistor 104 becomes conductive.

When the HR writing voltage pulse 10 (voltage is VH) is applied here between the bottom electrode terminal 101 and the top electrode terminal 102 of the memory cell, a voltage VH is applied across the variable resistance element 100 mostly as it is. However, when the LR writing voltage pulse 11 (voltage is −VL) is applied between the bottom electrode terminal 101 and the top electrode terminal 102 of the memory cell, a voltage applied across the variable resistance element 100 is negative (VL−Vth) where the threshold voltage of the NMOS transistor 104 is Vth. Thus, the voltage applied across the variable resistance element 100 is lowered by the threshold voltage of the NMOS transistor 104. This is because the NMOS transistor 104 is connected in a source follower connection upon the application of the LR writing voltage pulse 11 (voltage is −VL).

In (b) and (c) of FIG. 1, indicated on the vertical axis are cell currents (currents which flow through the variable resistance element 100) in the high resistance (HR) state and the low resistance (LR) state when a positive gate voltage VG is applied to the gate terminal 103 and a positive read voltage Vread is applied to the top electrode terminal 102 (at which time the ground potential is applied to the bottom electrode terminal 101) in the memory cell of FIG. 18 (at which time the voltage Vread is applied to the variable resistance element 100 mostly as it is), and indicated on the horizontal axis is the number of times the pulses are applied. At this time, the application of the voltage Vread does not cause the resistance change.

Parts (b) and (c) of FIG. 1 show examples of resistance change characteristics when, as shown in (a) of FIG. 1, the positive voltage VH as the HR writing voltage pulse 10 is applied between the bottom electrode terminal 101 and the top electrode terminal 102 at a predetermined pulse width, and the negative voltage −VL as the LR writing voltage pulse 11 is applied between the bottom electrode terminal 101 and the top electrode terminal 102 at a predetermined pulse width. At this time, the gate voltage VL is being applied to the gate terminal 103 where VL>VH is satisfied, provided that since the NMOS transistor 104 is connected in the source follower connection when the resistance state changes to the low resistance state, among the voltages actually applied to the variable resistance element, the voltage VH applied for the resistance change to the high resistance state is greater than the voltage (VL−Vth) applied for the resistance change to the low resistance state.

As shown in (b) of FIG. 1, in the normal resistance change operation, the cell currents in the HR state and the LR state respectively exhibit stable values within relatively narrow ranges. As shown in (c) of FIG. 1, however, once the "held HR state", namely, the failure (phenomenon where the resistance state changes to the HR state by application of a certain HR writing voltage pulse and, subsequently, the resistance change remains unchanged even if the LR writing voltage pulse is applied) in which the resistance state is held in the HR state occurs, the variable resistance element stays in the held HR state and does not recover from it, even if the normal HR writing voltage pulse 10 (voltage is VH) and the normal LR writing voltage pulse 11 (voltage is −VL) shown in (a) of FIG. 1 are repetitively and alternately applied.

Thus, the "held HR state" is presumed to occur due to a fact that when the HR writing voltage pulse is applied to the variable resistance element, oxygen ions in excess of the normal HR state are accidentally and undesirably present at the conductive path formed by the initial breakdown. A subject was found that once the "held HR state" occurs, it is difficult for the variable resistance element to readily recover from the "held HR state" by the application of the normal LR writing voltage pulse, ending up decreasing the number of write times (rewriting lifetime).

[Basic Data Concerning LR Recovery from the "Held HR State" According to the Present Invention]

In view of the above subject, through intensive studies on a method for writing the variable resistance nonvolatile memory element that can resolve the "held HR state" (the resolution is also referred to as "low resistance (LR) writing recovery" or simply referred to as "recovery"), in other words, the failure in which the variable resistance element is held in the HR state, the inventors found that the "held HR state" can be resolved by: conducting functional recovery of the conductive path by removing oxygen ions excessively present at the conductive path by application, to the variable resistance element, of a recovery-voltage pulse that has a greater amplitude than an absolute value of the normal rewriting voltage; or forming a new conductive path in addition to the conductive path at which oxygen ions are present excessively and, subsequently, causing the resistance change operation at the newly formed conductive path.

In the following, basic data concerning the low resistance (LR) writing recovery from the "held HR state" will be described first, and then, an embodiment according to the present invention will be described. It should be noted that embodiments described below are each merely a preferred illustration of the present invention. Values, shapes, materials, components, disposition or a form of connection between the components, steps, and the order of the steps are merely illustrative, and are not intended to limit the present invention. Moreover, among components of the embodiments below, components not set forth in the independent claims indicating the top level concept of the present invention will be described as optional components for preferable embodiments.

(1) LR Writing Recovery by Functional Recovery of Conductive Path (an Example of a "Preliminary Recovery Step")

First, "functional recovery of conductive path" which is one of recovery techniques ("preliminary recovery step") from the "held high resistance state" will be described.

The "preliminary recovery step" is a recovery step prior to a "strong recovery step" described below, and is one of write methods for reversibly changing the resistance state of a variable resistance nonvolatile memory element by applying voltage pulses to the variable resistance nonvolatile memory element.

Here, the variable resistance nonvolatile memory element (for example, the variable resistance element 100) includes a first electrode (for example, the bottom electrode 100*a*), a second electrode (for example, the top electrode 100*c*), and a variable resistance layer (for example, the variable resistance layer 100*b*) between the first electrode and the second electrode. The variable resistance layer includes a first transition metal oxide layer (for example, the first transition metal oxide layer 100*b*-1) in contact with the first electrode, and a second transition metal oxide layer (for example, the second transition metal oxide layer 100*b*-2) which is in contact with the second electrode and has oxygen deficiency smaller than the first transition metal oxide layer. It is assumed that the variable resistance nonvolatile memory element has characteristics of changing the resistance state from a first resistance state (for example, HR) for use in recording first information (for example, "0") to a second resistance state (for example, LR) for use in recording second information (for example, "1") when a pulse of the first voltage (for example, −VL) is applied to the variable resistance nonvolatile memory element, and changing the resistance state from the second resistance state (for example, LR) to the first resistance state (for example, HR) when a pulse of a second voltage (for example, VH) having a polarity different from the first voltage is applied to the variable resistance nonvolatile memory element.

When it is determined that the variable resistance nonvolatile memory element fails to change the resistance state to the second resistance state (for example, LR), remaining in the first resistance state (for example, HR) in a first determination step which determines whether (for example, the "held HR state" has occurred) the variable resistance nonvolatile memory element when applied with the pulse of the first voltage (for example, −VL) fails to change the resistance state to the second resistance state (for example, LR), remaining in the first resistance state (for example, HR), a set of preliminary recovery-voltage pulses is applied at least once to the variable resistance nonvolatile memory element in the "preliminary recovery step." The set of preliminary recovery-voltage pulses includes two pulses: (1) a first preliminary recovery-voltage (for example, positive voltage) pulse which has a greater amplitude than the second voltage (for example, VH), and the same polarity as the second voltage (for example, VH); and (2) a second preliminary recovery-voltage (for example, negative voltage) pulse which follows the first preliminary recovery-voltage pulse and has the same polarity as the first voltage (for example, −VL). Hereinafter, details of the "functional recovery of conductive path" by way of example of the "preliminary recovery step" will be described.

Figure 2:
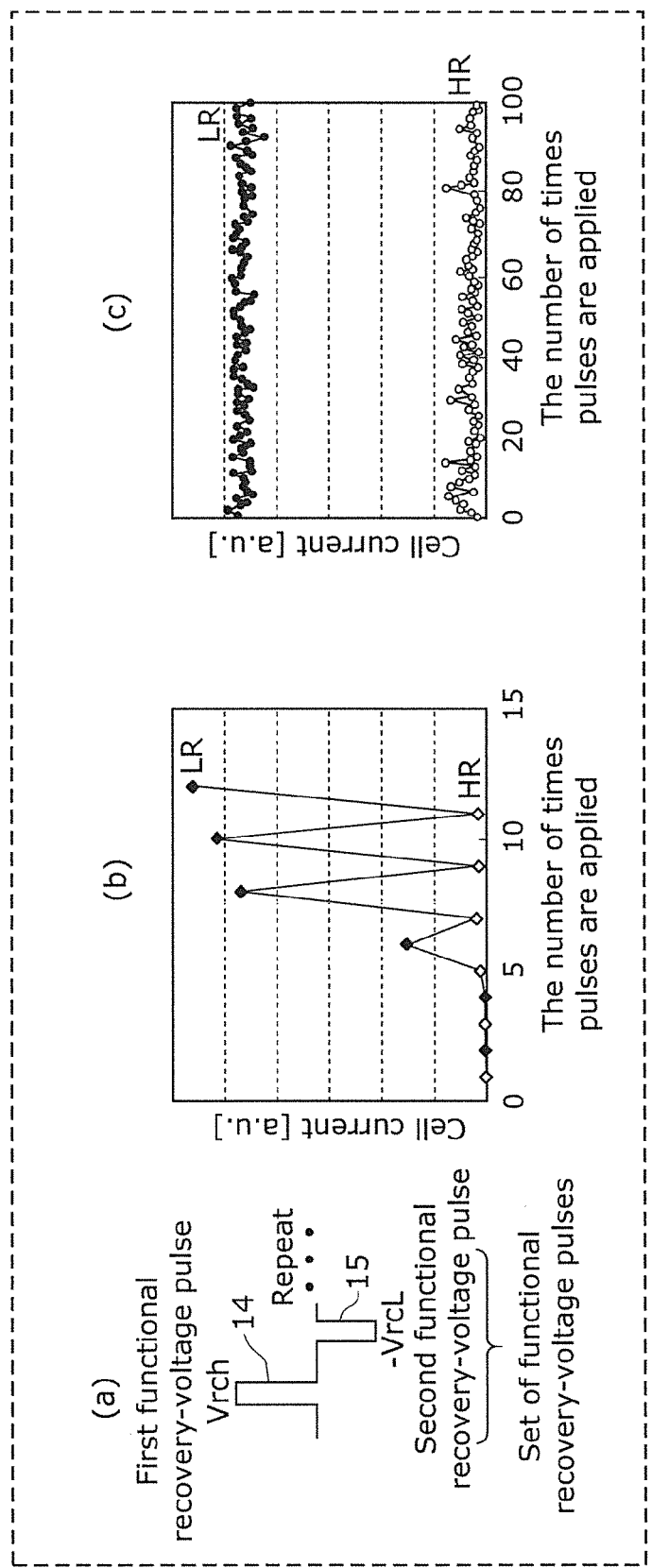
FIG. 2 Part (a) of FIG. 2 is a schematic view of a pulse waveform when a first functional recovery-voltage pulse and a second functional recovery-voltage pulse according to an embodiment of the present invention are repetitively and alternately applied to the variable resistance nonvolatile memory element, (b) of FIG. 2 is a diagram showing the recovery characteristic from the "held HR state" when the first functional recovery-voltage pulse and the second functional recovery-voltage pulse shown in (a) of FIG. 2 are repetitively and alternately applied to the variable resistance nonvolatile memory element, and (c) of FIG. 2 is a diagram showing normal resistance change characteristics of the variable resistance nonvolatile memory element after recovering from the "held HR state."

Part (b) of FIG. 2 shows an example of the LR writing recovery characteristic from the "held high resistance (HR) state" when a first functional recovery-voltage pulse 14 (voltage is Vrch) by way of example of the first preliminary recovery-voltage pulse shown in (a) of FIG. 2 and a second functional recovery-voltage pulse 15 (voltage is −Vrcl) by way of example of the second preliminary recovery-voltage pulse are repetitively and alternately applied multiple times between the bottom electrode terminal 101 and the top electrode terminal 102 of the 1T1R memory cell which includes the variable resistance element shown in FIG. 18. Part (c) of FIG. 2 shows an example of pulse resistance change characteristics after the LR writing recovery.

Here, Vrch>VH and Vrch≥Vrcl are satisfied. Vrcl may be higher or may be lower than VL insofar as Vrcl is a voltage near VL. VH is a voltage of the HR writing voltage pulse, and VL is a voltage of the LR writing voltage pulse. The application of the first functional recovery-voltage pulse 14 (voltage is Vrch) between the bottom electrode terminal 101 and the top electrode terminal 102 of the memory cell applies the voltage Vrch across the variable resistance element 100 almost as it is. In contrast, the application of the second functional recovery-voltage pulse 15 (voltage is −Vrcl) between the bottom electrode terminal 101 and the top electrode terminal 102 of the memory cell applies a negative voltage (Vrcl−Vth) across the variable resistance element 100. The negative voltage is lowered by the threshold voltage of the NMOS transistor 104 where Vth represents the threshold of the NMOS transistor 104.

The vertical axis and the horizontal axis in (b) and (c) of FIG. 2 are similar to those of (b) of FIG. 1.

Part (b) of FIG. 2 shows an example of resistance change characteristics, when, as shown in (a) of FIG. 2, the first functional recovery-voltage pulse 14 (voltage is Vrch) and the second functional recovery-voltage pulse 15 (voltage is −Vrcl) are repetitively and alternately applied to the memory cell in the "held HR state" shown in (c) of FIG. 1 at respective predetermined pulse widths. The voltage Vrch is higher than a normal high resistance writing voltage VH, and is a voltage (where Vbrh>Vrch>VH is satisfied wherein Vbrh represents a voltage which causes breakdown) which does not cause re-initial breakdown (Hereinafter, also referred to as a "rebreakdown."). At this time, a gate voltage Vrch is being applied to the gate terminal 103.

Here, the set of voltage pulses which includes the first functional recovery-voltage pulse 14 and the second functional recovery-voltage pulse 15 is defined as a "set of functional recovery-voltage pulses (an example of the set of preliminary recovery-voltage pulses)."

By repeating the application of the set of functional recovery pulses multiple times to the memory cell in the "held HR state", the cell current after the application of the second functional recovery-voltage pulse 15 increases, and the memory cell recovers from the "held HR state", as shown in (b) of FIG. 2. Subsequently, the normal resistance change voltage pulses (in the same conditions as (a) of FIG. 1) are alternately applied to the memory cell, wherein the HR writing voltage pulse 10 (voltage is VH) in the normal operation is applied to the memory cell at a predetermined pulse width and the LR writing voltage pulse 11 (voltage is −VL) in the normal operation is applied to the memory cell at a predetermined pulse width (here, VL>VH is satisfied and the gate voltage VL is applied to the gate terminal 103 of the transistor). This allows the memory cell to perform the resistance change stably, without the "held HR state" no longer occurring, as shown in (c) of FIG. 2.

Figure 3:
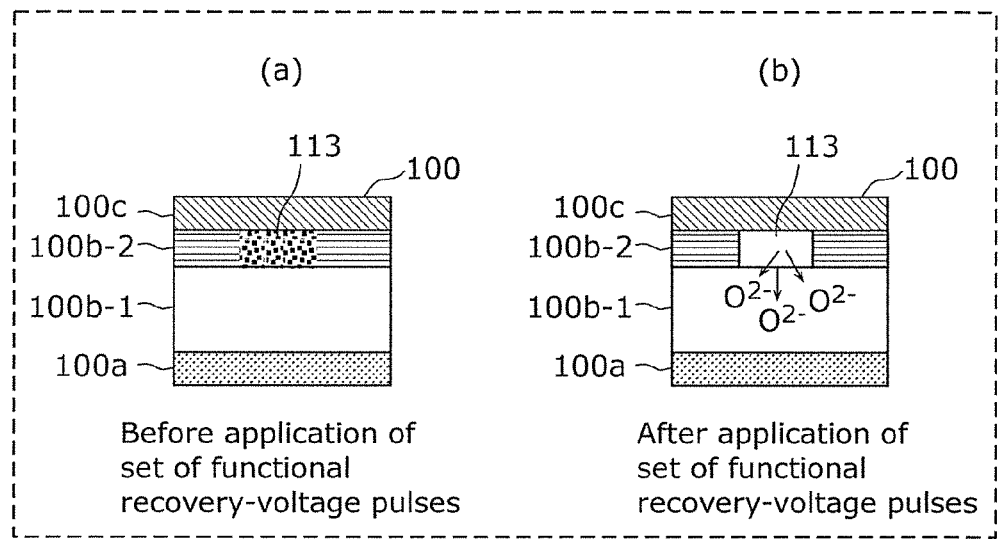
FIG. 3 Parts (a) and (b) of FIG. 3 are diagrams for explaining presumed mechanism for recovery of the variable resistance nonvolatile memory element from the "held HR state" by application of a set of functional recovery-voltage pulses according to the embodiment of the present invention.

Parts (a) and (b) of FIG. 3 are diagrams for explaining presumed mechanism for recovery of the variable resistance element 100 from the "held HR state" by the application of such a set of functional recovery-voltage pulses. The same reference signs are given in the FIG. 3 to refer to the same components as in FIG. 18, and the description is omitted.

Part (a) of FIG. 3 represents the variable resistance element 100 in the "held HR state." As shown in the figure, it is believed that when the variable resistance element 100 is in the "held HR state", oxygen ions present in a filament 113 formed in the second transition metal oxide layer 100b-2 are in excess of the normal high resistance state, and even the application of the normal LR writing voltage pulse does not change the resistance state of the filament (conductive path) to the low resistance state and the variable resistance element 100 is not functioning.

Then, as shown in (b) of FIG. 3, repetitive application of the set of functional recovery-voltage pulses to the variable resistance element 100 in which the "held HR state" has occurred is believed to remove the excessive oxygen ions ($O^{2-}$) in the filament, and the filament 113 recovers to the normal state.

Figure 4:
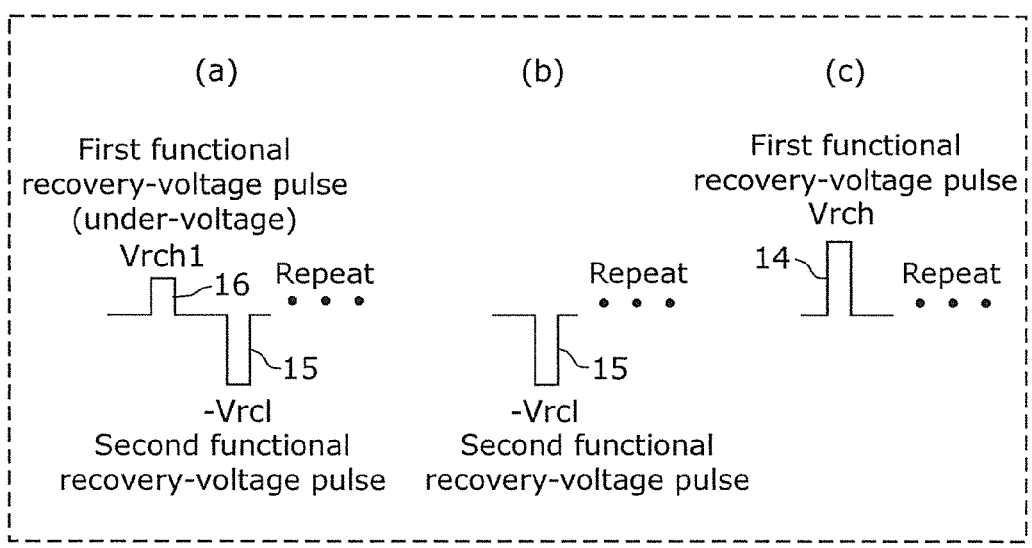
FIG. 4 Part (a) of FIG. 4 is a schematic view of a pulse waveform when a first functional recovery-voltage pulse having under-voltage and a second functional recovery-voltage pulse in a comparative example of the present invention are repetitively and alternately applied to the variable resistance nonvolatile memory element, (b) of FIG. 4 is a schematic view of a pulse waveform when only the second functional recovery-voltage pulse in the comparative example of the present invention is continuously applied to the variable resistance nonvolatile memory element, and (c) of FIG. 4 is a schematic view of a pulse waveform when only the first functional recovery-voltage pulse in the comparative example of the present invention is continuously applied to the variable resistance nonvolatile memory element.

The recovery of the resistance change characteristics as seen in (b) of FIG. 2 did not occur when, instead of the first functional recovery-voltage pulse 14 (voltage is Vrch) in (a) of FIG. 2, a positive voltage pulse 16 (voltage is Vrch1 where Vrch1<VH is satisfied), which has a voltage lower than the normal HR writing voltage pulse 10 (voltage is VH), and the second functional recovery-voltage pulse 15 (voltage is −Vrcl) are repetitively and alternately applied to the variable resistance element 100 in the "held HR state", as shown in (a) of FIG. 4. The recovery of the resistance change characteristics as seen in (b) of FIG. 2 did not occur also when only the second functional recovery-voltage pulse 15 (voltage is −Vrcl) is repetitively applied to the variable resistance element 100 in the "held HR state" as shown in (b) of FIG. 4, or when only the first functional recovery-voltage pulse 14 (voltage is Vrch) is repetitively applied to the variable resistance element 100 in the "held HR state" as shown in (c) of FIG. 4.

In summary, it is conceivable that the repetitive application of the set of functional recovery-voltage pulses to the memory cell in the "held HR state", wherein the first functional recovery-voltage pulse 14 (voltage is Vrch) which is higher than the normal HR writing voltage pulse 10 (voltage is VH) and has the voltage which does not cause the re-initial breakdown in the second transition metal oxide layer 100b-2 is applied to the memory cell, and, subsequently, the second functional recovery-voltage pulse 15 (voltage is −Vrcl) is applied, removes the oxygen ions excessively present in the filament from the filament, normalizing the filament, and as a result, the resistance change characteristics are stabilized, significantly extending the rewriting lifetime.

While herein, the pulse width of the first functional recovery-voltage pulse 14 (voltage is Vrch) included in the set of functional recovery-voltage pulses is the same as the pulse width of the second functional recovery-voltage pulse 15 (voltage is −Vrcl), the pulse width of the first functional recovery-voltage pulse 14 may be wider than the pulse width of the second functional recovery-voltage pulse 15 to enhance the effect to the recovery from the "held HR state" by application of the first functional recovery-voltage pulse 14 (voltage is Vrch).

(2) LR Writing Recovery by Re-Breakdown

Next, the re-breakdown which is one of the recovery techniques from the "held high resistance state" will be described.

Figure 5:
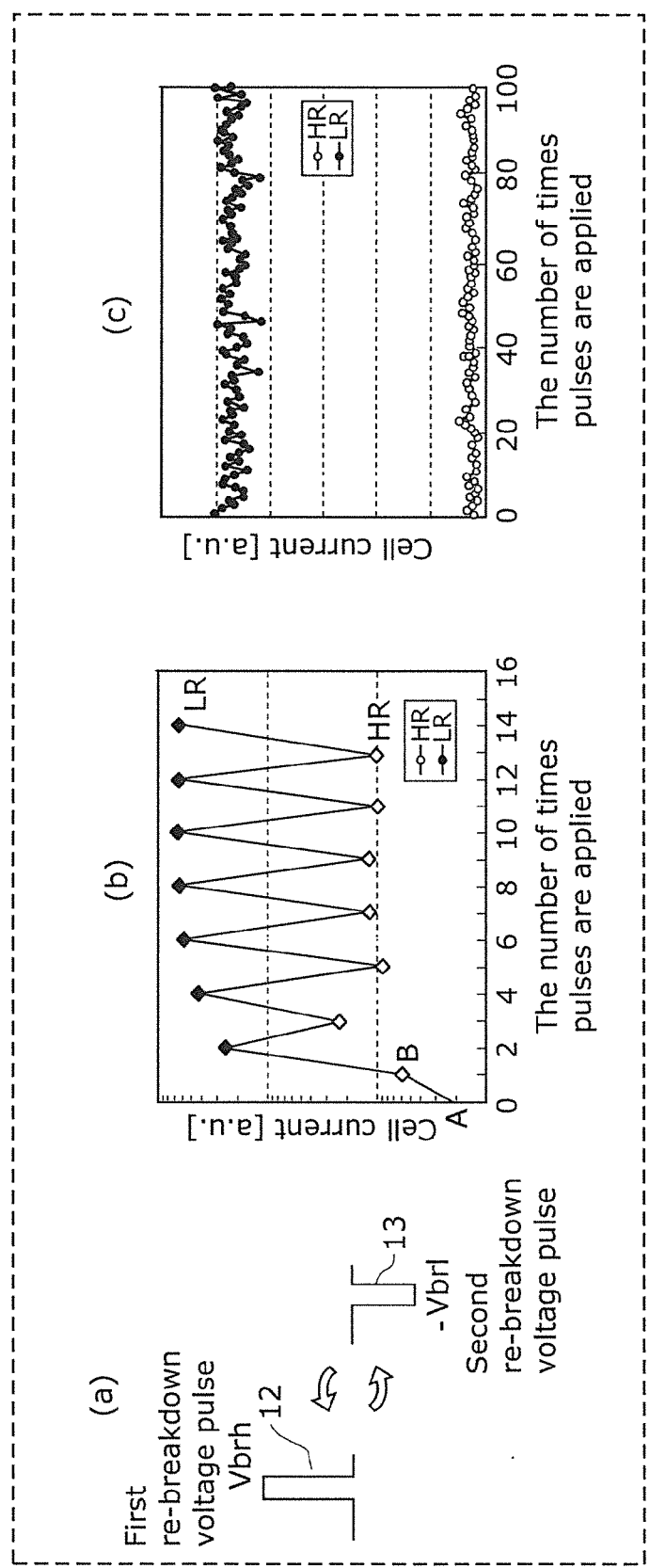
FIG. 5 Part (a) of FIG. 5 is a schematic view of a pulse waveform when a first re-breakdown voltage pulse and a second re-breakdown voltage pulse according to the embodiment of the present invention are repetitively and alternately applied to the variable resistance nonvolatile memory element, (b) of FIG. 5 is a diagram showing the recovery characteristic of the variable resistance nonvolatile memory element from the "held HR state" when the first re-breakdown voltage pulse and the second re-breakdown voltage pulse shown in (a) of FIG. 5 are repetitively and alternately applied to the variable resistance nonvolatile memory element, and (c) of FIG. 5 is a diagram showing the resistance change characteristics of the variable resistance nonvolatile memory element, which occurs in accordance with a normal pulse after the recovery from the "held HR state."

Part (b) of FIG. 5 shows an example of the LR writing recovery characteristic from the "held HR state" when a first re-breakdown voltage pulse 12 (voltage is Vbrh where Vbrh>Vrch>VH is satisfied) and a second re-breakdown voltage pulse 13 (voltage is −Vbrl) which are shown in (a) of FIG. 5 are repetitively and alternately applied multiple times to a 1T1R memory cell which includes the variable resistance element shown in FIG. 18. Part (c) of FIG. 5 shows an example of pulse resistance change characteristics after the LR writing recovery from the "held HR state."

In (b) and (c) of FIG. 5, indicated on the vertical axis and the horizontal axis are similar to those of (b) of FIG. 1.

Part (b) of FIG. 5 shows an example of resistance change characteristics when a voltage (voltage is Vbrh) which can cause the re-breakdown in the second transition metal oxide layer 100b-2 is applied as the first re-breakdown voltage pulse 12 (voltage is Vbrh) to the memory cell at a predetermined pulse width, and then the second re-breakdown voltage pulse 13 (voltage is −Vbrl) are applied, as shown in (a) of FIG. 5. At this time, a positive gate voltage Vbrh is being applied to the gate terminal 103 of the NMOS transistor 104.

In the "held HR state" (at point A), the memory cell is in the high resistance state below the resolution of measurement by a measuring instrument (i.e., exceeding the limit of the measurement). Once the first re-breakdown voltage pulse 12 (voltage is Vbrh) is applied to the memory cell, re-breakdown occurs in the second transition metal oxide layer 100b-2, newly forming a conductive path (filament) in the second transition metal oxide layer 100b-2. Thus, the memory cell has escaped from the "held HR state" (at point B).

When, subsequently, the second re-breakdown voltage pulse 13 (voltage is −Vbrl) and the first re-breakdown voltage pulse 12 (voltage is Vbrh) are repetitively and alternately applied to the memory cell, the cell current in the LR state gradually increases and is saturated as shown in (b) of FIG. 5. Subsequently, the normal resistance change voltage pulses are alternately applied to the memory cell, wherein the HR writing voltage pulse 10 (voltage is VH) in the normal operation is applied to the memory cell at a predetermined pulse width and the LR writing voltage pulse 11 (voltage is −VL) in the normal operation is applied to the memory cell at a predetermined pulse width (here, the gate voltage VL is being applied to the gate terminal 103 of the transistor). This allows the memory cell to perform the resistance change stably, without the "held HR state" no longer occurring as shown in (c) of FIG. 5.

It should be noted that the re-breakdown in the second transition metal oxide layer 100b-2 may occur only by the initial application of the first re-breakdown voltage pulse 12 (voltage is Vbrh). For example, in the resistance change characteristics of (b) of FIG. 5, the memory cell has escaped from the "held HR state" (at point B) by the initial application of the first re-breakdown voltage pulse 12 (voltage is Vbrh). In such a case, application of the second re-breakdown voltage (voltage is −Vbrl) 13, and the second and subsequent applications of the first re-breakdown voltage pulse 12 are not necessarily required.

More desirable resistance change characteristics may be provided or the re-breakdown may first occur by the application of the second re-breakdown voltage pulse 13 or by the repetitive application of the subsequent (the second and subsequent) first re-breakdown voltage pulse 12 and the second re-breakdown voltage pulse 13 (a set of both the pulses is referred to as a "set of re-breakdown voltage pulses."). Therefore, technical meaning of the application of the second re-breakdown voltage pulse 13 and the repetitive application of (the second and subsequent) first subsequent re-breakdown voltage pulse 12 and the second re-breakdown voltage pulse 13 is not denied.

Figure 6:
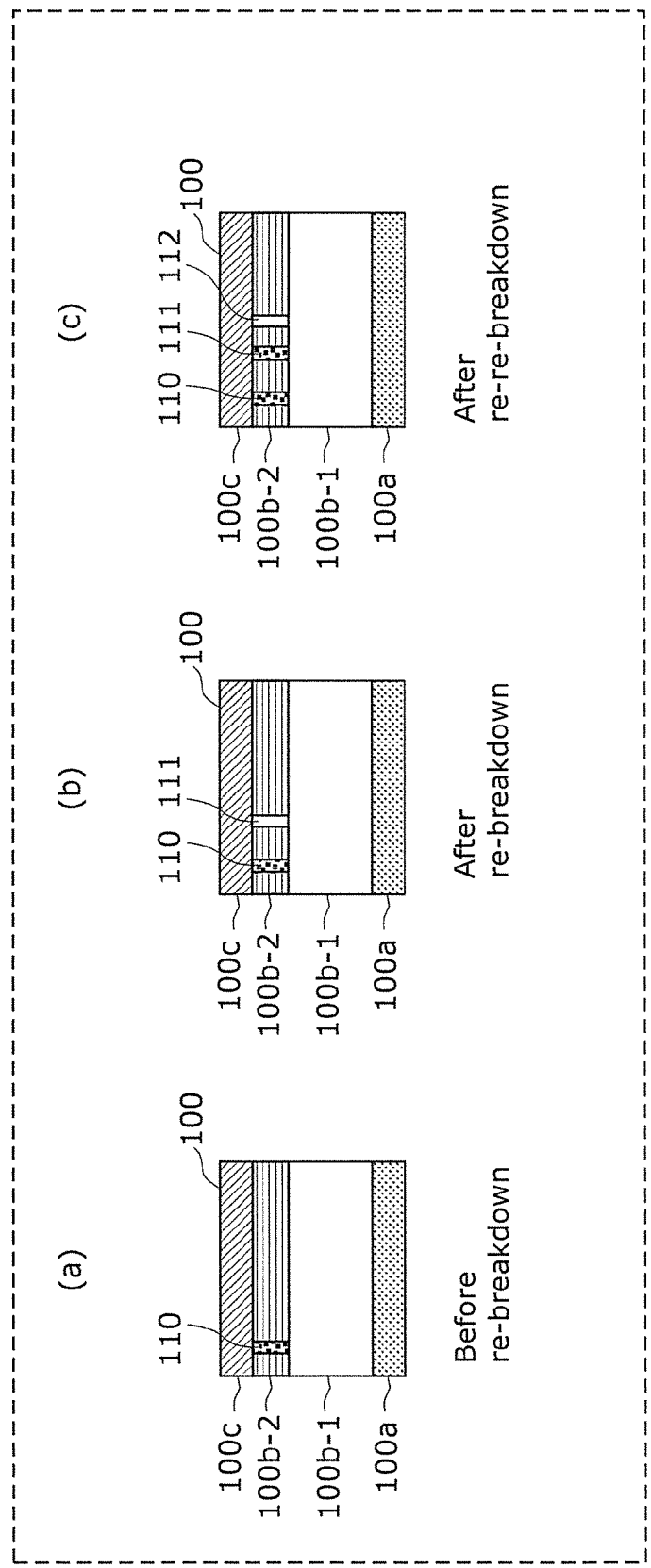
FIG. 6 Parts (a), (b), and (c) of FIG. 6 are diagrams for illustrating presumed mechanism for the recovery by the re-breakdown according to the embodiment of the present invention from the "held HR state."

Parts (a), (b), and (c) of FIG. 6 are diagrams for illustrating presumed mechanism for the recovery of the variable resistance element 100 from the "held HR state" by such re-breakdown. The same reference signs are given in the FIG. 6 to refer to the same components as in FIG. 18, and the description is omitted.

Part (a) of FIG. 6 represents the variable resistance element 100 in the "held HR state." As shown in the figure, it is believed that when the variable resistance element 100 is in the "held HR state", oxygen ions are present excessively in the filament 110, and thus the filament (conductive path) fails to change the resistance state to the low resistance state, and the variable resistance element 100 is not functioning.

Part (b) of FIG. 6 shows that a filament 111 is newly formed when the re-breakdown is caused in the variable resistance element 100 in which the "held HR state" has occurred. As shown in (c) of FIG. 6, it is believed that when the "held HR state" occurs also in the filament 111, re-re-breakdown is caused, further forming another new filament 112, and subsequently, whenever the filament is got blocked and the "held HR state" occurs, the re-breakdown and another filament formation are repeated, allowing for the recovery from the "held HR state."

Thus, by causing the re-breakdown, a new filament can be formed whenever a filament deteriorates and the "held HR state" occurs, thereby significantly extending the rewriting lifetime. Of course, the re-breakdown may be caused at the same filament area.

While the re-breakdown method forms the new filament by the application of a positive voltage, the re-breakdown may, of course, be caused by application of a negative voltage.

(3) LR Writing Recovery by an Increased Pulse Width of the LR Writing Voltage (an Example of "Strong Recovery Step") in (1) Functional Recovery of Conductive Path or in (2) Re-Breakdown Described Above.

Next, "strong recovery step" which is one of the recovery techniques from the "held high resistance state" will be described.

When the first determination step described above determines that the resistance state of the variable resistance nonvolatile memory element fails to change to the second resistance state (for example, LR), remaining in the first resistance state (for example, HR), a set of strong recovery-voltage pulses is applied at least once to the variable resistance nonvolatile memory element in the "strong recovery step." The set of strong recovery-voltage pulses includes two pulses: (1) a first strong recovery-voltage (for example, positive voltage) pulse which has a greater amplitude than a second voltage (for example, VH) and the same polarity as the second voltage (for example, VH); and (2) a second strong recovery-voltage (for example, negative voltage) pulse which follows the first strong recovery-voltage pulse, and has a longer pulse width than the pulse width of a first voltage (for example, −VL) and the same polarity as the first voltage (for example, −VL). Hereinafter, an example of the "strong recovery step" will be described.

Here, an LR writing recovery technique (an example of the "strong recovery step") will be described for a case where even (1) the LR writing recovery by functional recovery of conductive path and (2) the LR writing recovery by re-breakdown do not escape the memory cell from the "held HR state."

Figure 7:
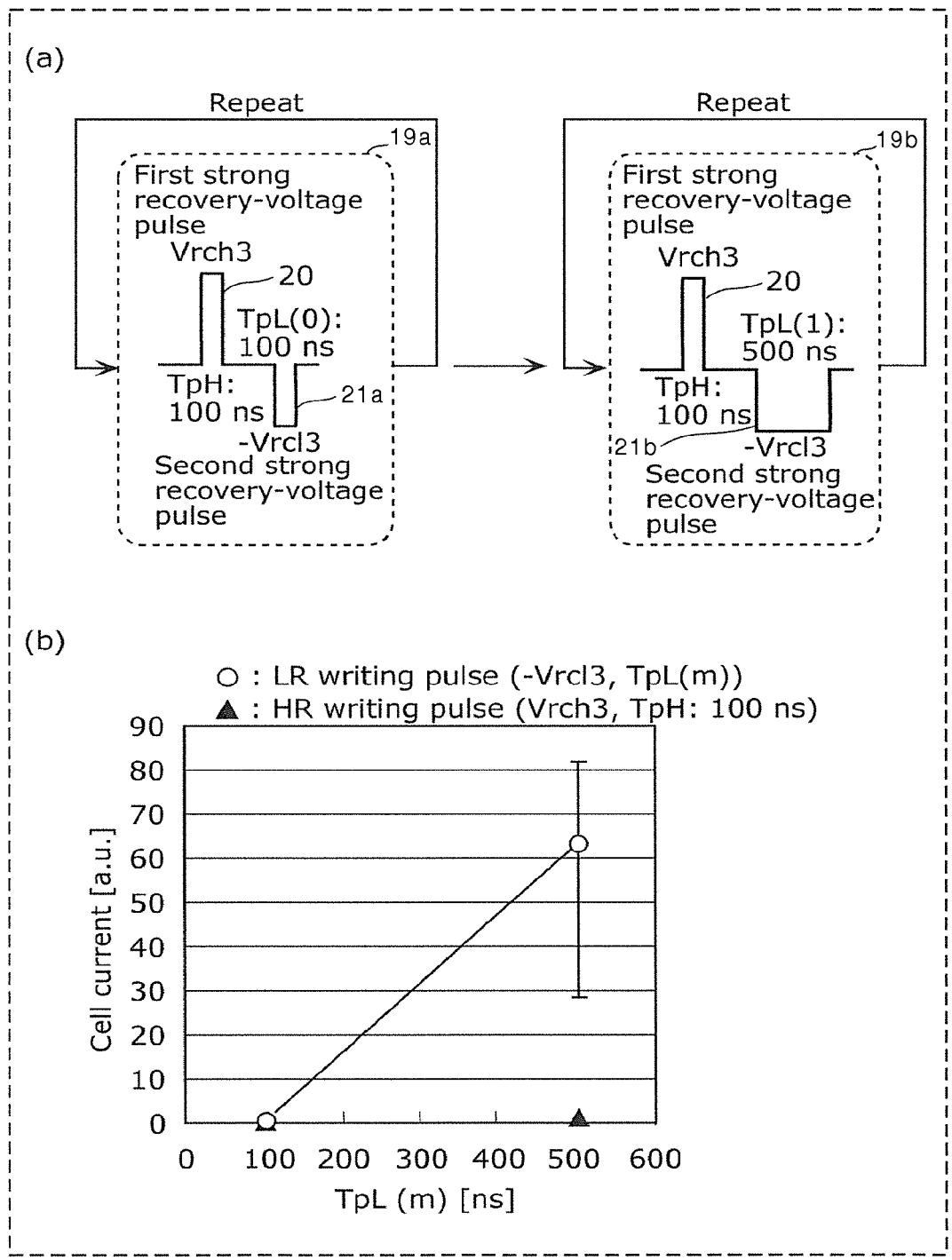
FIG. 7 Part (a) of FIG. 7 is a schematic view of a pulse waveform when a first strong recovery-voltage pulse and a second strong recovery-voltage pulse according to the embodiment of the present invention are repetitively and alternately applied to the variable resistance nonvolatile memory element, (b) of FIG. 7 is a diagram showing the recovery characteristic of the variable resistance nonvolatile memory element from the "held HR state" when the first strong recovery-voltage pulse and the second strong recovery-voltage pulse shown in (a) of FIG. 7 are repetitively and alternately applied to the variable resistance nonvolatile memory element.

Part (b) of FIG. 7 shows an example of the LR writing recovery characteristic from the "held HR state" when a set of the strong recovery-voltage pulses (pulse width TpL (0)=100 ns) is repetitively applied multiple times (10 times) to an 1T1R memory cell which includes the variable resistance element shown in FIG. 18, and then the set of strong recovery-voltage pulses having an increased pulse width TpL (1) (=500 ns) is repetitively applied multiple times (10 times) to the 1T1R memory cell. A set of voltage pulses including a first strong recovery-voltage pulse (voltage is Vrch3, here Vrch3>VH is satisfied, and a pulse width TpH is 100 ns) and a second strong recovery-voltage pulse (voltage−Vrcl3, pulse width TpL (m) where m=0, 1, and so on) is defined as the "set of strong recovery-voltage pulses." It should be noted that in part (a) of FIG. 7 shows, by example, (i) a set 19*a* of strong recovery-voltage pulses including a first strong recovery-voltage pulse 20 with a pulse width TpH=100 ns and a second strong recovery-voltage pulse 21*a* with a pulse width TpL(0) =100 ns and (ii) a set 19*b* of the strong recovery-voltage pulses including a first strong recovery-voltage pulse 20 with a pulse width TpH=100 ns and a second strong recovery-voltage pulse 21*b* with a pulse width TpL(1)=500 ns. It should be noted that the first strong recovery-voltage pulse may have the same voltage, same polarity, and same pulse width as the first functional recovery-voltage pulse 14 or the first re-breakdown voltage pulse 12. Also, the second strong recovery-voltage pulse may have the same voltage and same polarity as the second functional recovery-voltage pulse 15 or the second re-breakdown voltage pulse 13.

In (b) of FIG. 7, indicated on the horizontal axis is the pulse width of the second strong recovery-voltage pulse and indicated on the vertical axis are average cell currents and an error bar for HR/LR (respective maximal values and respective minimum values at 10 measurements) when the resistance change characteristics is measured as in (b) of FIG. 5.

As shown in (b) of FIG. 7, when the pulse width TpL (0) (here, 100 ns) of the second strong recovery-voltage pulse is substantially the same as the pulse width of the normal LR writing voltage pulse 11 (voltage is −VL), even the application of the second strong recovery-voltage pulse still unable to escape the memory cell from the "held HR state." Subsequently, when the pulse width of the second strong recovery-voltage pulse is increased from TpL (0) (=100 ns) to TpL (1) (=500 ns), reduction ability improves, removing oxygen ions presents excessively in a filament from the inside of the filament and normalizing the filament. Thus, the memory cell has successfully escaped from the "held HR state" by the first application of the second strong recovery-voltage pulse. Thus, even if firm "held HR state" occurs, by sequentially increasing the pulse width TpL (m) (m=0, 1, 2, and so on) of the second strong recovery-voltage pulse, the reduction ability improves sequentially, the removal of the oxygen ions excessively present from the inside of the filament is facilitated, and the memory cell is facilitated to escape from the "held HR state."

Herein, as an example, the case has been described where the memory cell escapes from the "held HR state" by the application of the set of strong recovery-voltage pulses after the pulse width is increased. When the "held HR state" is not overcome by the one application of the set of strong recovery-voltage pulses after the pulse width is increased, the memory cell may be recovered from the "held HR state" by a multiple number of applications of the set of strong recovery-voltage pulses or by setting the pulse width of the second strong recovery-voltage pulse to a pulse width longer than TpL (1) (=500 ns) (for example, TpL (2)=1 µs, TpL (3)=5 µs, TpL (4)=10 µs, TpL (5)=50 µs, and so on).

Alternatively, a value (for example, 500 ns) distinctly greater than the pulse width of the normal LR writing voltage pulse 11 (voltage is −VL) may be employed as the first pulse width TpL (0) of the second strong recovery-voltage pulse. For example, when the pulse width of the normal LR writing voltage pulse 11 (voltage is −VL) is 100 ns, the pulse width of the second strong recovery-voltage pulse is, preferably, set to TpL (0)=500 ns, TpL (1)=1 µs, TpL (2)=5 µs, TpL (3)=10 µs, TpL (4)=50 µs, TpL (5)=100 µs, and so on.

[Variable Resistance Nonvolatile Memory Device According to Embodiment of the Present Invention]

Based on the findings obtained from the above-described basic data concerning the LR writing recovery from the "held HR state", the inventors have devised a nonvolatile memory device which performs suitable LR writing recovery operation on a bad cell in the "held HR state." Hereinafter, a 1T1R nonvolatile memory device which includes the variable resistance element shown in FIG. 18 will be described, with reference to an embodiment according to the present invention.

Figure 8:
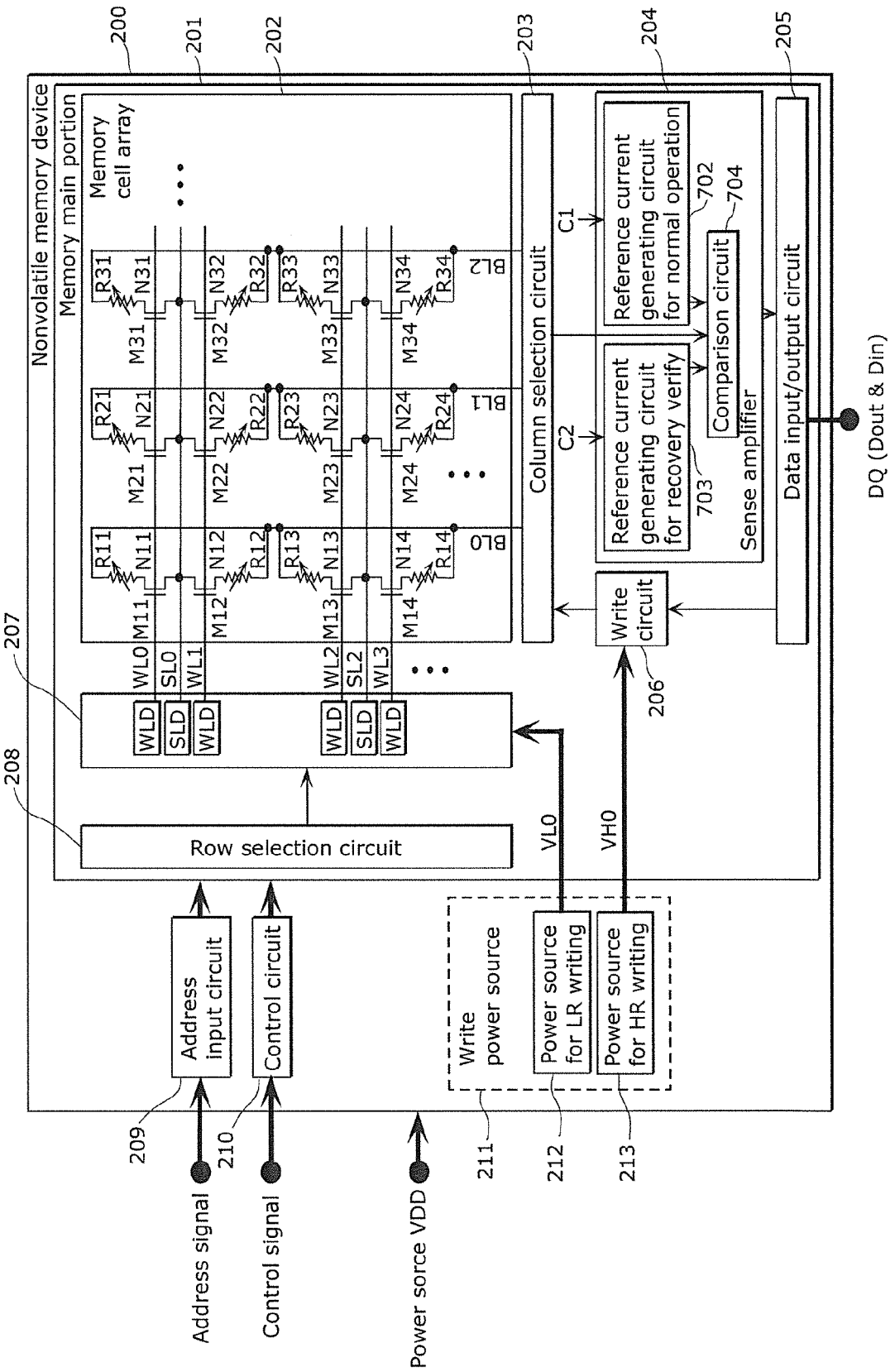
FIG. 8 is a block diagram of a variable resistance nonvolatile memory device according to the embodiment of the present invention.

FIG. 8 is a block diagram of a nonvolatile memory device according to an embodiment of the present invention.

A nonvolatile memory device 200 is a variable resistance nonvolatile memory device which includes memory cell M11 in which a variable resistance nonvolatile memory element and a switching element are connected in series, and a drive circuit (peripheral circuitry) which drives the memory cells.

Here, the variable resistance nonvolatile memory element (for example, the variable resistance element 100) includes a first electrode (for example, the bottom electrode 100a), a second electrode (for example, the top electrode 100c), and a variable resistance layer (for example, the variable resistance layer 100b) between the first electrode and the second electrode. The variable resistance layer includes a first transition metal oxide layer (for example, the first transition metal oxide layer 100b-1) in contact with the first electrode, and a second transition metal oxide layer (for example, the second transition metal oxide layer 100b-2) which is in contact with the second electrode and has oxygen deficiency smaller than the first transition metal oxide layer. It is assumed that the variable resistance nonvolatile memory element has characteristics of changing the resistance state from a first resistance state (for example, HR) for use in recording first information (for example, "0") to a second resistance state (for example, LR) for use in recording second information (for example, "1") when a pulse of the first voltage (for example, −VL) is applied to the variable resistance nonvolatile memory element, and changing the resistance state from the second resistance state (for example, LR) to the first resistance state (for example, HR) when a pulse of a second voltage (for example, VH) having a polarity different from the first voltage is applied to the variable resistance nonvolatile memory element.

The drive circuit includes a write circuit 206 which writes to the memory cells, a sense amplifier 204 which reads from the memory cells, and a control circuit 210 which performs, using the sense amplifier 204, a first determination step as to whether (for example, the "held HR state" has occurred) the resistance state of the variable resistance nonvolatile memory element when applied with the first voltage (for example, −VL) pulse by the write circuit 206 fails to change to the second resistance state (for example, LR), remaining in the first resistance state (for example, HR).

Here, when the first determination step determines that the resistance state of the variable resistance nonvolatile memory element fails to change to the second resistance state (for example, LR), remaining in the first resistance state (for example, HR), the control circuit 210 controls the write circuit 206 to perform a strong recovery step which applies a set of strong recovery-voltage pulses at least once to the variable resistance nonvolatile memory element. The set of strong recovery-voltage pulses includes two pulses: (1) a first strong recovery-voltage (for example, positive voltage) pulse which has a greater amplitude than the second voltage (for example, VH) and the same polarity as the second voltage; and (2) a second strong recovery-voltage (for example, negative voltage) pulse which follows the first strong recovery-voltage pulse, and has a longer pulse width than the pulse width of the first voltage (for example, −VL) and the same polarity as the first voltage (for example, −VL).

As alternative operation, when the first determination step determines that the resistance state of the variable resistance nonvolatile memory element fails to change to the second resistance state (for example, LR), remaining in the first resistance state (for example, HR), the control circuit 210 further controls the write circuit 206 to perform, prior to the strong recovery step, a preliminary recovery step which applies a set of preliminary recovery voltage pulses at least once to the variable resistance nonvolatile memory element. The set of preliminary recovery voltage pulses includes two pulses: (1) a first preliminary recovery voltage (for example, positive voltage) pulse which has a greater amplitude than the second voltage (for example, VH) and the same polarity as the second voltage; and (2) a second preliminary recovery voltage (for example, negative voltage) pulse which follows the first preliminary recovery-voltage pulse and has the same polarity as the first voltage (for example, −VL). Then, if the resistance state of the variable resistance nonvolatile memory element, even after the preliminary recovery step, fails to change to the second resistance state (for example, LR), the control circuit 210 controls the write circuit 206 to perform the strong recovery step which applies the set of strong recovery-voltage pulses at least once to the variable resistance nonvolatile memory element. Here, the first preliminary recovery-voltage pulse and the first strong recovery-voltage pulse may be equal in amplitude.

The control circuit 210 further performs, using the sense amplifier 204, a second determination step which determines whether the resistance state of the variable resistance nonvolatile memory element has changed to the second resistance state (for example, LR) by the application of the second strong recovery-voltage pulse. By controlling the write circuit 206 and the sense amplifier 204, the control circuit 210 repeats the application of the set of strong recovery-voltage pulses and the determination by the second determination step, until the resistance state of the variable resistance nonvolatile memory element has reached the second resistance state (for example, LR).

Hereinafter, details of such a nonvolatile memory device 200 will be described.

As shown in FIG. 8, the nonvolatile memory device 200 according to the present embodiment includes a memory main portion 201 on a semiconductor substrate. The memory main portion 201 includes a memory cell array 202 which includes the 1T1R memory cells shown in FIG. 18, a row selection circuit 208, a row driver 207 which includes word line driver circuits WLD and source line driver circuits SLD, a column selection circuit 203, a write circuit 206 for causing breakdown and writing data, the sense amplifier 204 which detects an amount of current flowing through a selected bit line to determine the high resistance state as data "0" and determine the low resistance state as data "1", and a data input/output circuit 205 which performs input and output processing of input and output data via a terminal DQ.

The nonvolatile memory device 200 further includes a write power source 211 which includes a power source 213 for high resistance (HR) writing and a power source 212 for low resistance (LR) writing.

The nonvolatile memory device 200 further includes an address input circuit 209 which receives an address signal inputted from outside, and the control circuit 210 which controls, based on a control signal inputted from outside, operation of the memory main portion 201.

The memory cell array 202 includes, on the semiconductor substrate, a plurality of word lines WL0, WL1, WL2, WL3, and so on and a plurality of bit lines BL0, BL1, BL2, and so on arranged to cross each other. The memory cell array 202 further includes a plurality of NMOS transistors N11, N12, N13, N14, and so on, N21, N22, N23, N24, and so on, N31, N32, N33, N34, and so on (hereinafter, represented by "transistors N11, N12, and so on") provided as switching elements in correspondence with cross-points between the word lines WL0, WL1, WL2, WL3, and so on and the bit lines BL0, BL1, BL2, and so on, and a plurality of variable resistance elements R11, R12, R13, R14, and so on, R21, R22, R23, R24, and so on, R31, R32, R33, R34, and so on (hereinafter, represented by "variable resistance elements R11, R12, and so on") serially connected in one-to-one correspondence with the respective transistors N11, N12, and so on, which form the respective memory cells M11, M12, M13, M14, and so on, M21, M22, M23, M24, and so on, M31, M32, M33, M34, and so on (hereinafter, represented by "memory cells M11, M12, and so on").

As shown in FIG. 8, gates of the transistors N11, N21, N31, and so on are connected to the word line WL0, gates of the transistors N12, N22, N32, and so on are connected to the word line WL1, gates of the transistors N13, N23, N33, and so on are connected to the word line WL2, and gates of the transistors N14, N24, N34, and so on are connected to the word line WL3.

Moreover, the transistors N11, N21, N31, and so on and the transistors N12, N22, N32, and so on are connected to a source line SL0 in a shared manner, the transistors N13, N23, N33, and so on and the transistors N14, N24, N34, and so on are connected to a source line SL2 in a shared manner. Specifically, the source lines SL0, SL2, and so on are disposed in parallel with the word lines WL0, WL1, WL2, WL3, and so on, and crossing (in the vertical direction in the present embodiment) the bit lines BL0, BL1, BL2, and so on.

The variable resistance elements R11, R12, R13, R14, and so on are connected to the bit line BL0, the variable resistance elements R21, R22, R23, R24, and so on are connected to the bit line BL1, and the variable resistance elements R31, R32, R33, R34, and so on are connected to the bit line BL2. Thus, the memory cell array 202 according to the present embodiment has a configuration in which the variable resistance elements R11, R21, R31, and so on are directly connected to the respective bit lines BL0, BL1, BL2, and so on, without intervening the NMOS transistors N11, N21, N31 and so on.

While in the above configuration example, the source lines are disposed in parallel with the word lines, the source lines may be disposed in parallel with the bit lines. Also while the source lines provide common potential to the transistors connected thereto, the above configuration may include a source line selection circuit/driver which has the similar configuration to the row selection circuit/driver, and drive a selected source line and an unselected source line by different voltages (including polarity).

In the LR writing recovery operation, the control circuit 210 outputs to the write circuit 206 an LR writing recovery signal instructing application of a predetermined recovery voltage. In data write cycle, the control circuit 210 outputs to the write circuit 206 a write signal instructing application of a write voltage to a bit line, according to input data Din inputted to the data input/output circuit 205. In data read cycle, on the other hand, the control circuit 210 outputs to the sense amplifier 204 a read signal instructing read operation.

The row selection circuit 208 receives a row address signal outputted from the address input circuit 209, and according to the row address signal, causes the row driver 207 to select one of the plurality of word lines WL0, WL1, WL2, WL3, and so on, and applies a predetermined voltage to the selected word line using a corresponding word line driver circuit WLD.

Likewise, the row selection circuit 208 receives the row address signal outputted from the address input circuit 209, and according to the row address signal, causes the row driver 207 to select one of the plurality of source lines SL0, SL2, and so on, and applies a predetermined voltage to the selected source line using a corresponding source line driver circuit SLD.

When the write circuit 206 receives the LR writing recovery signal outputted from the control circuit 210, the write circuit 206 applies a voltage pulse for LR writing recovery operation having a predetermined amplitude to a bit line selected by the column selection circuit 203 at a predetermined pulse width. When the write circuit 206 receives a write signal outputted from the control circuit 210, the write circuit 206 applies a write voltage in the normal operation to the bit line selected by the column selection circuit 203.

The write power source 211 includes the power source 212 for LR writing and the power source 213 for HR writing. An output voltage VL0 of the power source 212 for LR writing is inputted to the row driver 207, and an output voltage VH0 of the power source 213 for HR writing is inputted to the write circuit 206.

Figure 9:
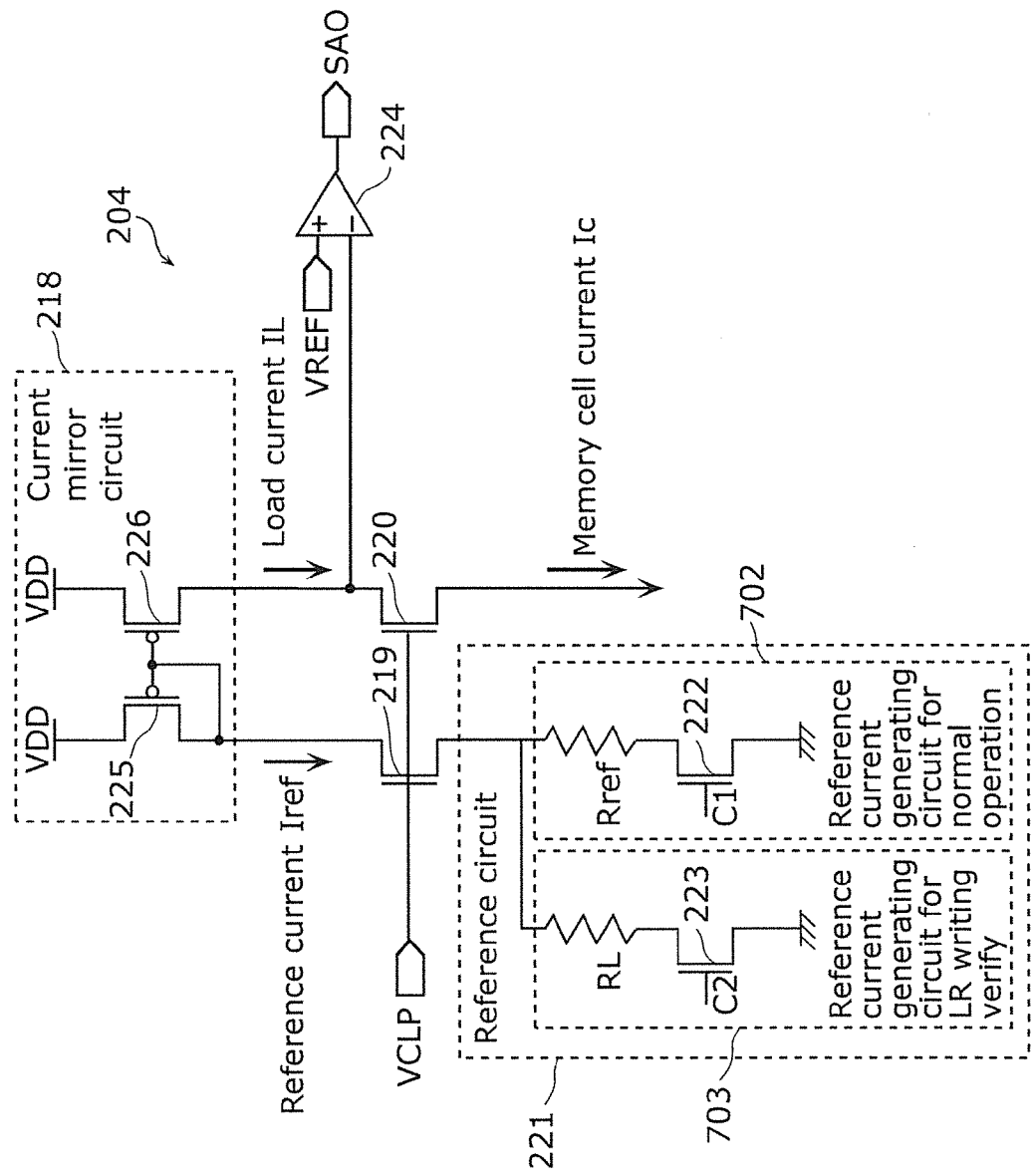
FIG. 9 is a circuit diagram showing an example of the detailed configuration of a sense amplifier according to the embodiment of the present invention.

FIG. 9 is a circuit diagram showing an example of the detailed configuration of the sense amplifier 204 in FIG. 8.

The sense amplifier 204, by way of example, includes a current mirror circuit 218 the mirror ratio of which is 1 to 1, clamping transistors 219 and 220 having the same size, a reference circuit 221, and a differential amplifier 224. The reference circuit 221 includes a reference current generating circuit 702 for normal operation and a reference current generating circuit 703 for LR writing verify.

In the reference current generating circuit 702 for normal operation, one end of a branch at which a selection transistor 222 and a reference resistance Rref for normal read are connected in series is connected to ground potential, and the other end is connected to the source terminal of the clamping transistor 219. A read enable signal C1 is inputted to the gate terminal of the selection transistor 222, and the read enable signal C1 switches the selection transistor 222 between conductive and non-conductive.

Likewise, in the reference current generating circuit 703 for LR writing verify, one end of a branch at which the selection transistor 223 and a reference resistance RL for LR writing verify (RL<Rref) are connected in series is connected to ground potential, and the other end is connected to the source terminal of the clamping transistor 219. An LR writing verify enable signal C2 is inputted to the gate terminal of the selection transistor 223, and the LR writing verify enable signal C2 switches the selection transistor 223 between conductive and non-conductive.

A clamping voltage VCLP (VCLP<VDD) is inputted to the gate terminals of the clamping transistors 219 and 220. The source terminal of the clamping transistor 220 is connected to the memory cells via the column selection circuit 203 and the bit lines. The drain terminals of the clamping transistors 219 and 220 are respectively connected to the drain terminals of transistors 225 and 226 included in the current mirror circuit 218. The differential amplifier 224 compares potential at the drain terminal of the clamping transistor 220 with reference potential VREF, further inverts and amplifies the potential, and conveys it as a sense amplifier output SAO to the data input/output circuit 205.

Figure 10:
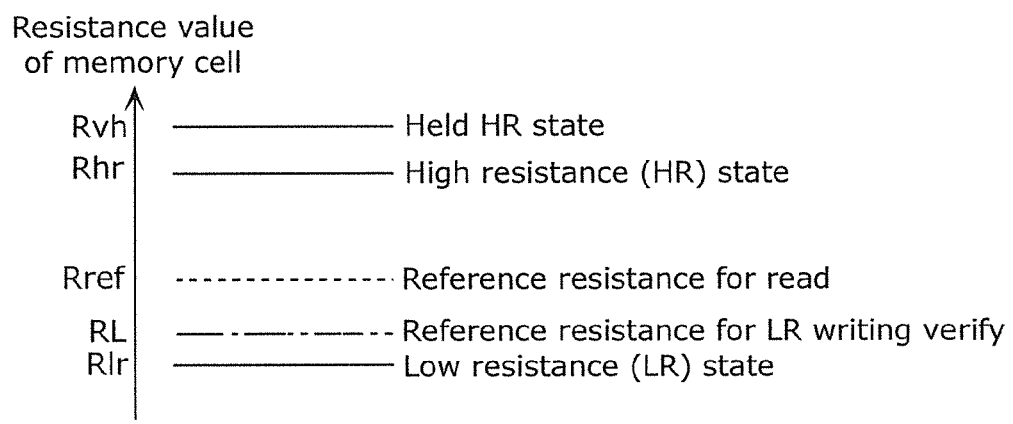
FIG. 10 is a diagram for illustrating determination levels of the sense amplifier according to the embodiment of the present invention.

FIG. 10 is a diagram for illustrating determination levels of the thus configured sense amplifier 204. The sense amplifier 204, as shown in FIG. 10, has two determination levels between a resistance value (=Rhr) of a memory cell in the high resistance (HR) state and a resistance value (=Rlr) of a memory cell in the low resistance (LR) state. The determination levels include the reference resistance Rref for normal read (Rlr<Rref<Rhr) and the reference resistance RL for LR writing verify (Rlr<RL<Rref) smaller than the reference resistance Rref.

It should be noted that to be used for the determination as to whether the LR writing to the variable resistance element is completed, the reference resistance RL for LR writing verify is set to a resistance value greater than the resistance value in the low resistance state LR. Preferably, the reference resistance RL for LR writing verify is set to a value close to the resistance value in the low resistance (LR) state. To be used for the determination as to whether the variable resistance element is in the high resistance state or in the low resistance state, the reference resistance Rref for normal read is set to a resistance value smaller than the resistance value in the high resistance state HR and greater than the resistance value in the low resistance state LR.

The resistance value of the memory cell in the "held HR state" is represented by Rvh (Rvh>Rhr).

[Operation of Variable Resistance Nonvolatile Memory Device According to Embodiment of the Present Invention]

Operation of primary circuit blocks of the variable resistance nonvolatile memory device configured as set forth above will be described first, and then normal operation of the variable resistance nonvolatile memory device, the LR writing recovery operation by the functional recovery of conductive path, and the LR writing recovery operation by the re-breakdown will be described.

First, operation of the sense amplifier 204 shown in FIG. 9 will be described. In the LR write step which changes the resistance state of the variable resistance element to the low resistance state, after a negative voltage pulse for LR writing is applied to the variable resistance element, the sense amplifier 204 is connected to a target memory cell via the column selection circuit 203 and the bit line. The memory cell is not applied with a voltage greater than a voltage (VCLP−Vth) obtained by reducing the clamping voltage VCLP by a threshold voltage (Vth) of the clamping transistors 219 and 220.

On the other hand, in the reference circuit 221, the LR writing verify enable signal C2 activates the selection transistor 223 to be conductive, and the reference resistance RL for LR writing is selected. The read enable signal C1 deactivates the other selection transistor 222 to be non conductive. Thus, a reference current Iref (=(VCLP−Vth)/RL) flows as an output of the reference circuit 221.

Thus, the reference current Iref is transferred by the current mirror circuit 218, and substantially the same current as Iref flows as a load current IL (IL=Iref). The clamping transistor 220 compares the magnitude relationship between the load current IL and a memory cell current Ic. Depending on a result of the comparison, whether the drain terminal voltage of the clamping transistor 220 is higher or lower than a reference voltage VREF is detected by the differential amplifier 224, and the differential amplifier 224 outputs the sense amplifier output SAO.

Here, when Rvh (the resistance value in the "held HR state", Rvh>Rhr>RL>Rlr) represents the resistance value of the variable resistance element after the application of the LR writing voltage pulse (voltage is −VL) thereto, the memory cell current Ic (=(VCLP−Vth)/Rvh) flows, upon which the load current IL is greater than the memory cell current Ic, the drain terminal voltage of the clamping transistor 220 is greater than the reference voltage VREF which is to be inputted after a predetermined time to the differential amplifier 224, and the sense amplifier output SAO outputs level L. In other words, when the selected memory cell is in the "held HR state" (Rvh) higher than the reference resistance RL for LR writing, the sense amplifier 204 determines "0", i.e., fail.

On the other hand, when the resistance value of the selected memory cell after the application of the LR writing voltage pulse (voltage is −VL) thereto is Rlr (<RL), i.e., lower than the reference resistance RL for LR writing verify due to the functional recovery of conductive path or formation of a new conductive path by the re-breakdown, the memory cell current Ic (=(VCLP−Vth)/Rlr) flows, upon which the load current IL is smaller than the memory cell current Ic, the drain terminal voltage of the clamping transistor 220 is lower than the reference voltage VREF to be inputted after a predetermined time to the differential amplifier 224, and the sense amplifier output SAO outputs level H. In other words, when the selected memory cell is in the resistance state (Rlr) lower than the reference resistance RL for LR writing verify, the sense amplifier 204 determines "1", i.e., pass, indicating that the LR writing to the target cell is completed.

At normal read, in the reference circuit 221, the read enable signal C1 activates the selection transistor 222 to be conductive, and the reference resistance Rref for normal read is selected. The LR writing verify enable signal C2 deactivates the other selection transistor 223 to be non-conductive. Thus, the reference current Iref (=(VCLP−Vth)/Rref) flows as the output of the reference circuit 221.

Thus, the reference current Iref is transferred by the current mirror circuit 218, and substantially the same current as Iref flows as a load current IL (IL=Iref). The magnitude relationship between the load current IL and a memory cell current Ic is compared. Depending on a result of the comparison, whether the drain terminal voltage of the clamping transistor 220 is higher or lower than a reference voltage VREF is detected by the differential amplifier 224, and the differential amplifier 224 outputs the sense amplifier output SAO.

Here, when Rhr represents the resistance value of the memory cell in the high resistance state and Rlr (Rhr>Rref>Rlr) represents the resistance value of the memory cell in the low resistance state, the memory cell current Ic (=(VCLP−Vth)/Rhr) flows when the selected memory cell is in the high resistance state, upon which the load current IL is greater than the memory cell current Ic, the drain terminal voltage of the clamping transistor 220 is greater than the reference voltage VREF that is to be inputted to the differential amplifier 224, and the sense amplifier output SAO outputs the level L. In other words, when the selected memory cell is in the high resistance state (Rhr) higher than the reference resistance Rref for normal read, the sense amplifier 204 determines "0" data.

On the other hand, the memory cell current Ic (=(VCLP−Vth)/Rlr) flows when the selected memory cell is in the low resistance state, upon which the load current IL is smaller than the memory cell current Ic, the drain terminal voltage of the clamping transistor 220 is lower than the reference voltage VREF that is to be inputted to the differential amplifier 224, and the sense amplifier output SAO outputs the level H. In other words, when the selected memory cell is in the low resistance state (Rlr) lower than the reference resistance Rref for normal read, the sense amplifier 204 determines "1" data.

Next, referring to FIG. 11, description will be given with respect to voltage pulses to be applied to the memory cells in respective operations: the high resistance (HR) writing, the low resistance (LR) writing, and the normal read in the normal operation; application of the first and second functional recovery-voltage pulses, and LR writing verify-read in the LR writing recovery operation by the functional recovery of conductive path; application of the first and second re-breakdown voltage pulses, and read after the re-breakdown in the LR writing recovery operation by the re-breakdown; and voltages to be applied to the word lines (WL), the source lines (SL), and the bit lines (BL) for applying the voltage pulses to the memory cells. The voltages to be applied to the word lines (WL), the source lines (SL), and the bit lines (BL) are, as described below, generated by the power source 212 for LR writing and the power source 213 for HR writing.

In FIG. 11, the voltage VL for the LR writing voltage pulse in the normal operation is generated by the power source 212 for LR writing and applied from the word line driver circuit WLD to the word line. A voltage VH for the HR writing voltage pulse in the normal operation is generated by the power source 213 for HR writing and supplied to the write circuit 206.

In the LR writing recovery operation by the functional recovery of conductive path, a bit line BL voltage at the application of the first functional recovery-voltage pulse represents a voltage pulse of the voltage Vrch, and the bit line BL voltage at the application of the second functional recovery-voltage pulse represents a voltage pulse of the voltage −Vrcl. At the application of the second functional recovery-voltage pulse, the power source 212 for LR writing generates and applies a voltage Vrcl from the word line driver circuit WLD and the source line driver circuit SLD to the word line and the source line, respectively. The power source 213 for HR writing generates and applies the voltage Vrcl to the bit line via the write circuit 206.

In the LR writing recovery operation by the re-breakdown, the bit line BL voltage at the application of the first re-breakdown voltage pulse represents a voltage pulse of the voltage Vbrh, and the bit line BL voltage at the application of the second re-breakdown voltage pulse represents a voltage pulse of the voltage −Vbrl. At the application of the second re-breakdown voltage pulse, the power source 212 for LR writing generates and applies the voltage Vbrl from the word line driver circuit WLD and the source line driver circuit SLD to the word line and the source line, respectively. The power source 213 for HR writing generates and applies the voltage Vbrl to the bit line via the write circuit 206.

At the normal read, LR writing verify-read, and read after the re-breakdown, the voltage Vread is a read voltage clamped by the sense amplifier 204, and corresponds to a voltage value adjusted so as not to cause read disturbs (i.e., so as not to change the resistance state of the variable resistance element). VDD corresponds to a power supply voltage supplied to the nonvolatile memory device 200.

While FIG. 11 does not clearly indicates the set of preliminary recovery voltage pulses and the set of strong recovery-voltage pulses, voltages and polarities of the set of voltage pulses are the same as those of the set of functional recovery-voltage pulses or the set of re-breakdown voltage pulses.

Examples of the data write cycle, data read cycle, and LR writing recovery operation of the variable resistance nonvolatile memory device 200 configured as set forth above will be described, by way of example, with reference to (a), (b), and (c) of FIG. 12, and the block diagram of the variable resistance nonvolatile memory device 200 of FIG. 8 according to the embodiment of the present invention.

Figure 12:
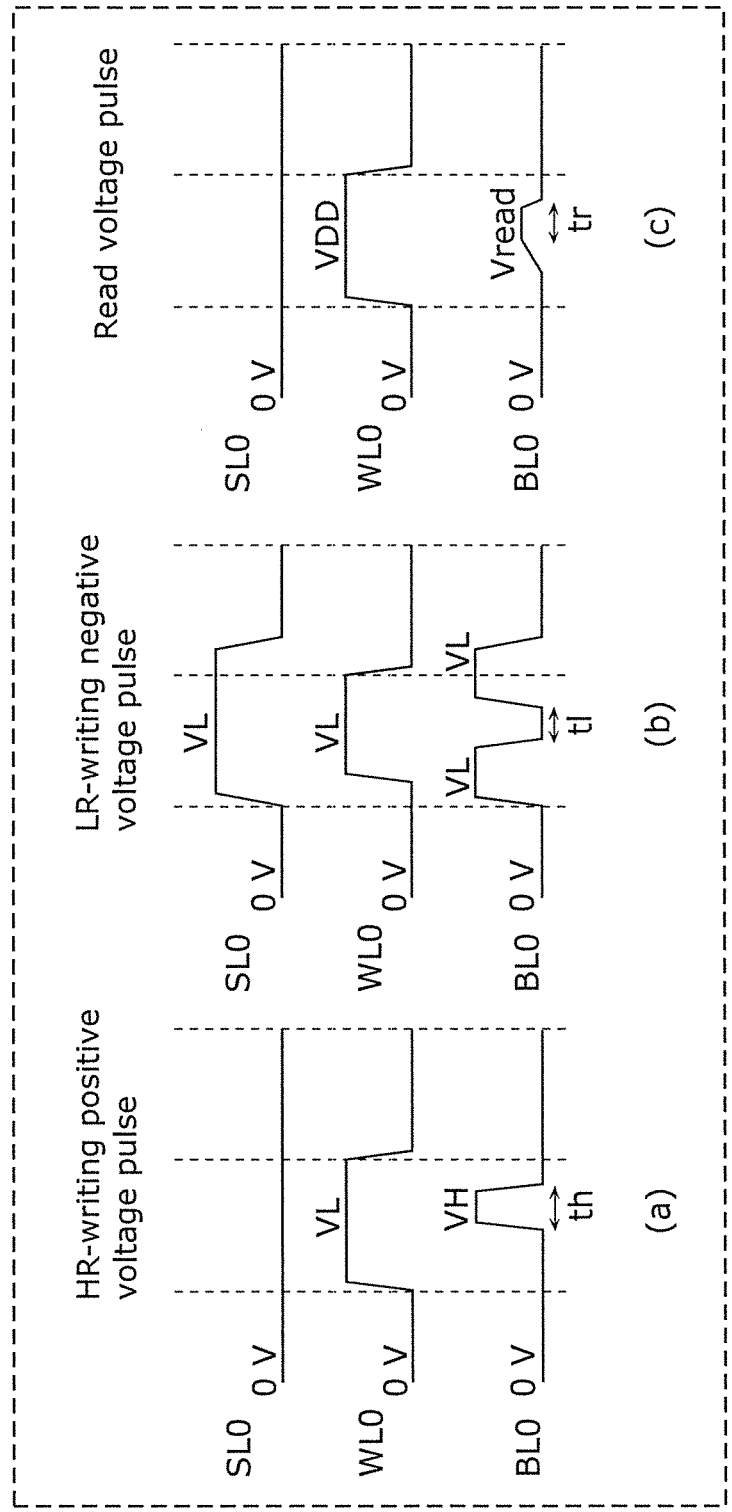
FIG. 12 Parts (a), (b), and (c) of FIG. 12 are diagrams showing the operation timing of the variable resistance nonvolatile memory device according to the embodiment of the present invention.

Parts (a) to (c) of FIG. 12 are timing diagrams showing example operation of the nonvolatile memory device 200 according to the embodiment of the present invention. Here, defining that data "0" is assigned to the variable resistance layer in the high resistance state and data "1" is assigned to the variable resistance layer in the low resistance state, its example operation will be shown. The description below assumes that data is to be written to or read from one memory cell (for example, the memory cell M11).

Part (a) of FIG. 12 shows the timing diagram of an HR writing (data "0" write) cycle to the memory cell M11 in the normal operation. In the cycle, the HR writing voltage pulse (voltage is VH) is applied to the memory cell M11.

In the cycle, a selected bit line BL0 and the source line SL0 are initially set to a voltage 0V. Next, the word line WL0 to be selected is set to the voltage VL (VL>VH), and the NMOS transistor N11 of the selected memory cell M11 of FIG. 8 is turned on.

Next, the selected bit line BL0 is set to the voltage VH for a time th, and, subsequently, a pulse waveform is applied to the selected bit line BL0 again to cause the selected bit line BL0 to have the voltage 0V. At this stage, the positive voltage pulse VH is applied to the memory cell M11 of FIG. 8 to write to the memory cell M11 so that the resistance value of the memory cell M11 changes from the low resistance state to the high resistance state. In other words, the source line and the word line select the memory cells in the row direction, and, subsequently, the pulse waveform in the positive voltage direction is applied to a specific bit line, thereby applying the positive voltage pulse to the variable resistance element of a memory cell that is selected by the source line, the word line, and the bit line. It should be noted that the HR writing cycle is not limited to the above method.

Also in the LR writing recovery operation, except for voltages used, the first functional recovery-voltage pulse, the first re-breakdown voltage pulse, or the first strong recovery-voltage pulse which is a positive voltage pulse is applied in the similar manner to the above-described method. In this case, the positive voltage Vrch for the functional recovery of conductive path, or the positive voltage Vbrh which causes the re-breakdown is applied to the memory cell M11 of FIG. 8, a new filament is formed by the functional recovery of conductive path or the re-breakdown, which decreases the resistance value of the memory cell M11 in the "held HR state". Thus, the resistance state of the memory cell M11 is changed to a state where the resistance change is possible, by application of a driving voltage pulse in the normal operation.

Subsequently, the word line WL0 is set to the voltage 0V, which completes the data "0" write in the normal operation, the application of the first functional recovery-voltage pulse, the first re-breakdown voltage pulse, or the first strong recovery-voltage pulse in the LR writing recovery operation. Here, a voltage which sufficiently reduces the ON resistance of the NMOS transistor N11 is applied to the word line WL0.

In other words, memory cells in the row direction are selected by the source line and the word line, and, subsequently, the pulse waveform in the positive voltage direction is applied to a specific bit line, thereby applying the positive voltage pulse to the variable resistance element of a memory cell selected by the source line, the word line, and the bit line. It should be noted that the application of the positive voltage pulse to the selected variable resistance element is not limited to the above method.

In the LR writing recovery operation, subsequently, the second functional recovery-voltage pulse, the second re-breakdown voltage pulse, or the second strong recovery-voltage pulse is applied to the variable resistance element, according to the method of applying the negative voltage pulse described in (b) of FIG. 12, and further a pair of the positive pulse application and the negative pulse application is repeated for multiple times, thereby changing the resistance state of the variable resistance element from the "held HR state" to the state where the resistance change is possible.

Part (b) of FIG. 12 shows the timing diagram of an LR writing (data "1" write) cycle to the memory cell M11 in the normal operation. In the cycle, the LR writing voltage pulse (voltage is −VL) is applied to the memory cell M11.

In the cycle, the selected bit line BL0 and the source line SL0 are initially set to the voltage 0V. Next, the selected bit line BL0 and the source line SL0 are set to the voltage VL. Next, the word line WL0 to be selected is set to the voltage VL. At this time, the NMOS transistor N11 of the selected memory cell M11 in FIG. 8 is still off. At this stage, the voltage VL is applied to both the drain terminal and the source terminal of the NMOS transistor N11 of FIG. 8. Thus, a current does not flow irrespective of the on and off of the transistor.

Next, the selected bit line BL0 is set to the voltage 0V for a time t1, and, subsequently, the pulse waveform is applied to the selected bit line BL0 again to cause the selected bit line BL0 to have the voltage VL. At this stage, the voltage pulse of the LR writing voltage (−VL) is applied to the memory cell M11 of FIG. 8, and the resistance value of the memory cell M11 changes from a high resistance value to a low resistance value. Subsequently, the word line WL0 is set to the voltage 0V, which completes the application of the LR writing voltage pulse in the data "1" write operation. It should be noted that the LR writing cycle is not limited to the above method.

Also in the LR writing recovery operation, except for voltages used, the second functional recovery-voltage pulse, the second re-breakdown voltage pulse, or the second strong recovery-voltage pulse which is the negative voltage pulse is applied in a manner similar to the above-described method. In this case, the negative voltage Vrcl for the functional recovery of conductive path or the negative voltage Vbrl after the re-breakdown is applied to the memory cell M11 of FIG. 8, the resistance state of a new filament by the functional recovery of conductive path or the re-breakdown is changed to the low resistance state. Thus, the resistance state of the memory cell M11 is changed to a state where the resistance change is possible, by application of a driving voltage pulse in the normal operation.

Subsequently, the word line WL0 is set to the voltage 0V, which completes the data "1" write in the normal operation, the application of the second functional recovery-voltage pulse, the second re-breakdown voltage pulse, or the second strong recovery-voltage pulse in the LR writing recovery operation. Here, a voltage which extremely reduces the ON resistance of the NMOS transistor N11 is applied to the word line WL0.

In other words, memory cells in the row direction are selected by the source line and the word line, and, subsequently, the pulse waveform in the negative voltage direction is applied to a specific bit line, thereby applying the negative voltage pulse to the variable resistance element of a memory cell selected by the source line, the word line, and the bit line to change the resistance state of the variable resistance element to the low resistance state.

In the LR writing recovery operation, as mentioned above, the first functional recovery-voltage pulse, the first re-breakdown voltage pulse, or the first strong recovery-voltage pulse is applied to the variable resistance element according to the method of applying the positive voltage pulse described in (a) of FIG. 12, subsequently, the second functional recovery-voltage pulse, the second re-breakdown voltage pulse, or the second strong recovery-voltage pulse is applied according to the method of applying the negative voltage pulse described in (b) of FIG. 12, and further a pair of the positive pulse application and the negative pulse application is repeated multiple times, thereby changing the resistance state of the variable resistance element from the "held HR" state to a state where the resistance change is possible.

Part (c) of FIG. 12 shows the timing diagram of a cycle of reading data from the memory cell M11. In the read cycle, the selected bit line BL0 and the source line SL0 are initially set to the voltage 0V. Next, the word line WL0 to be selected is set to the voltage VDD (VDD>Vread), and the NMOS transistor N11 of the selected memory cell M11 is turned on.

Next, the selected bit line BL0 is set to the read voltage Vread for a time tr, and the sense amplifier 204 detects a value of current flowing through the selected memory cell M11, thereby determining that data stored in the selected memory cell M11 is data "0" or data "1." Subsequently, the word line WL0 is set to the voltage 0V, which completes the data read operation.

For the read operation, the read method shown in (c) of FIG. 12 is similar to those in the normal operation and the LR writing recovery operation, except (FIG. 10) that in the sense amplifier 204, the reference resistance Rref for read is used in the normal operation and the reference resistance for LR writing verify is used in the LR writing recovery operation (both the functional recovery of conductive path and the re-breakdown). It should be noted that the read operation is not necessarily performed at every positive pulse application and every negative pulse application in the LR writing recovery operation.

Figure 13:
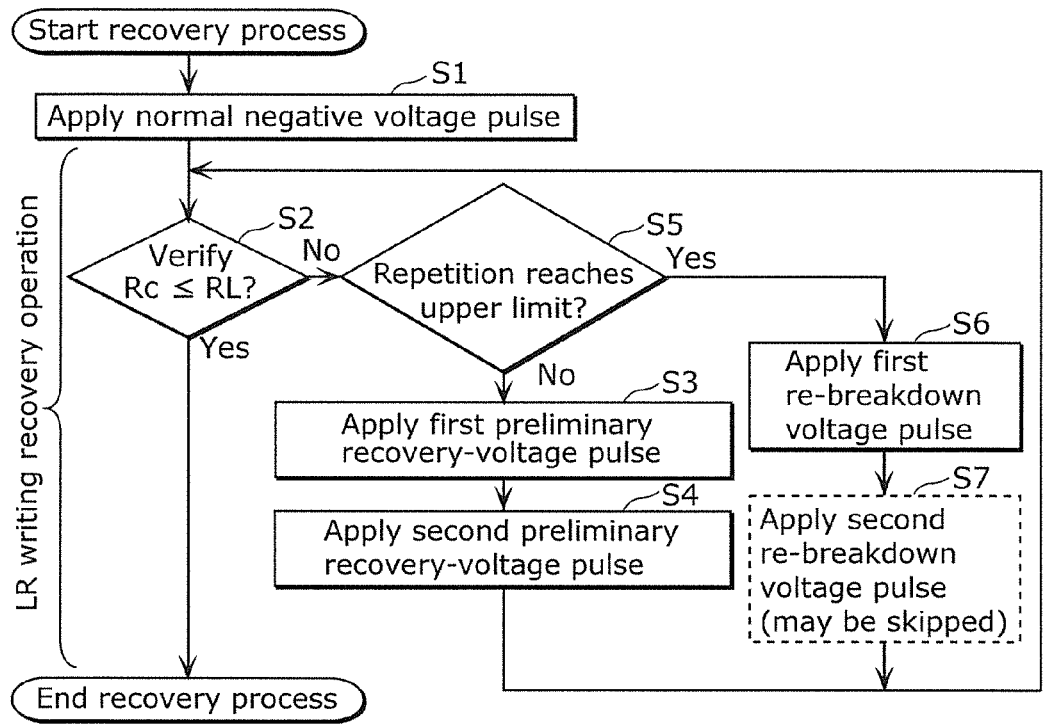
FIG. 13 is a flowchart illustrating LR writing for the variable resistance nonvolatile memory device according to the embodiment of the present invention to recover from the "held HR state."

Next, an example of the LR writing recovery operation in the variable resistance nonvolatile memory device will be described, with reference to the flowchart illustrated in FIG. 13. As illustrated in FIG. 13, first, when a memory cell (hereinafter, a selected memory cell) corresponding to a selection address is in the high resistance (HR) state and desired to be changed to the low resistance (LR) state, the normal LR writing voltage pulse (voltage is −VL) is applied to the selected memory cell (S1), and, next, LR writing verify-read is performed which determines whether a resistance value Rc of the selected memory cell is less than or equal to the reference resistance RL (Rc≤RL) (S2), under control of the control circuit 210. Here, when the resistance value Rc of the selected memory cell is less than or equal to the reference resistance RL for LR writing verify (Rc≤RL) (Yes in S2), the control circuit 210 determines that the LR writing is successfully completed without the "held HR state" occurring. On the other hand, when the resistance value Rc of the selected memory cell is greater than the reference resistance RL for LR writing verify (Rc>RL) (No in S2), the control circuit 210 determines that the "held HR state" is occurring and enters the LR writing recovery operation. Here, the LR writing recovery operation includes the preliminary recovery step (here, the functional recovery of conductive path) and the re-breakdown.

In the LR writing recovery operation, the control circuit 210 applies the first preliminary recovery-voltage pulse (for example, the first functional recovery-voltage pulse (voltage is Vrch)) to the selected memory cell (S3), next, applies the second preliminary recovery-voltage pulse (for example, the second functional recovery-voltage pulse (voltage is −Vrcl)) to the selected memory cell (S4), and performs the LR writing verify-read again (S2). Such a process (the application of the set of preliminary recovery voltage pulses) is repeated (No in S5) until it is verified that the resistance state has successfully changed to the low resistance (LR) state (Yes in S2), or for a predetermined upper limit number of times (Yes in S5).

When the above-mentioned process is repeated the predetermined upper limit number of times without success in changing the resistance state to the low resistance (LR) state (Yes in S5), the control circuit 210 applies the first re-breakdown voltage pulse (voltage is Vbrh) (S6), and applies the second re-breakdown voltage pulse (voltage is −Vbrl) (S7) to cause the re-breakdown for the LR writing recovery. Here, steps S6 and S7 may be repeated for a predetermined number of times. Alternatively, considering that the re-breakdown may occur by application of only the first re-breakdown voltage pulse (voltage is Vbrh) as mentioned above, step S7 may be skipped and the re-breakdown may be caused only in step S6.

Here, steps S1, S4, and S7 correspond to the timing diagram illustrated in (b) of FIG. 12, steps S3 and S6 correspond to the timing diagram illustrated in (a) of FIG. 12, and step S2 corresponds to the timing diagram illustrated in (c) of FIG. 12.

Thus, the "held HR state" can be eliminated by the LR writing recovery operation from the "held HR state" according to the present embodiment. Thus, the resistance change operation of the memory cell array stabilizes significantly, allowing for extended rewriting lifetime.

[Variation of Flowchart of LR Writing Recovery Operation]

Next, referring to the flowchart illustrated in FIG. 14, description will be given with respect to the LR writing recovery operation which includes the strong recovery step, when a strong "held HR state" has occurred in which the memory cell shows no LR writing recovery even by the LR writing recovery operation illustrated in FIG. 13. The same reference signs are given in FIG. 14 to refer to the same steps illustrated in FIG. 13 and the description thereof will be omitted. Here, the pulse width TpL (m) (m=0, 1, 2, and so on, TpL (0)<TpL (1)<TpL (2)< and so on) of the second strong recovery-voltage pulse which is the LR writing voltage pulse is sequentially increased for every predetermined number of applications thereof until the LR writing recovery is achieved.

Figure 14:
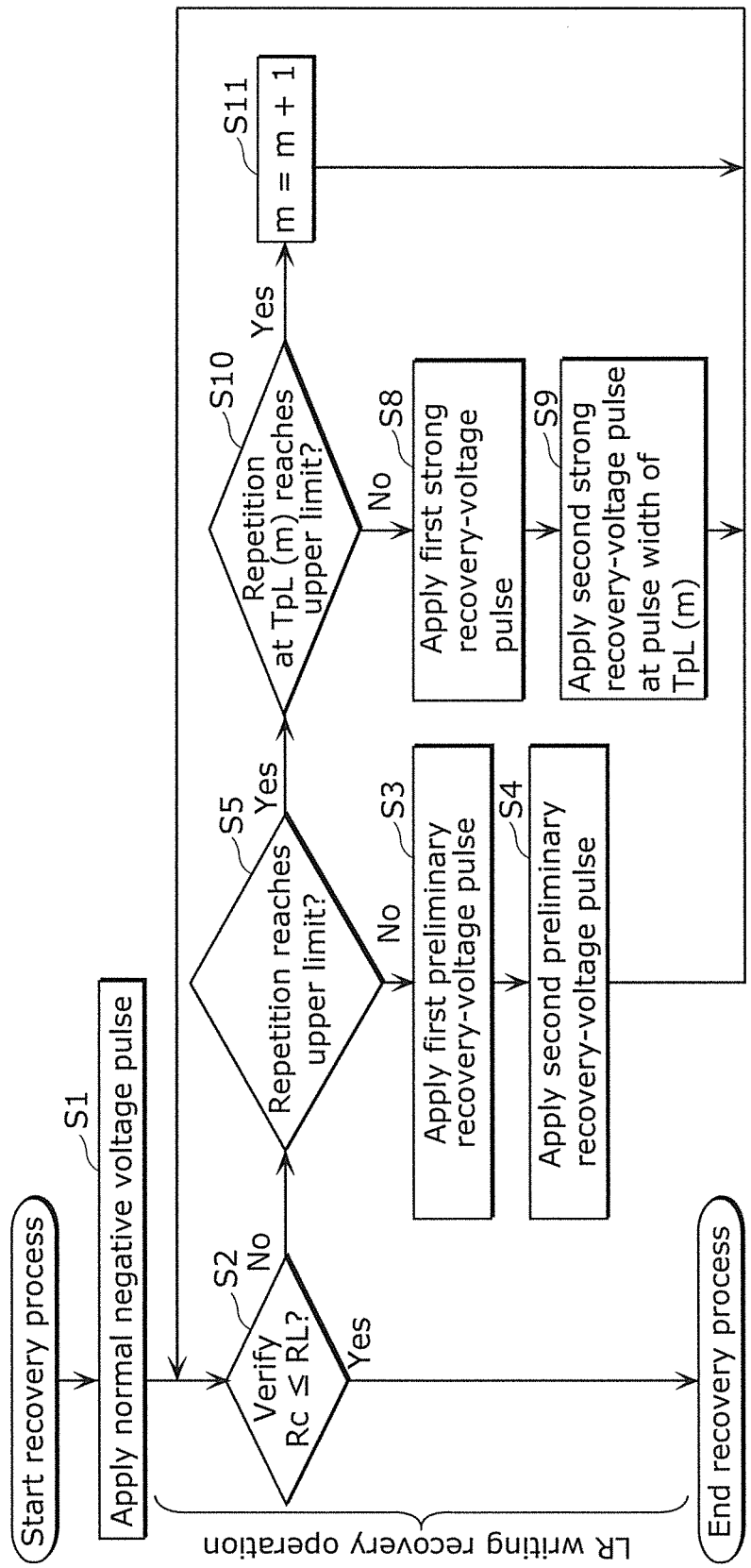
FIG. 14 is a flowchart illustrating LR writing for the variable resistance nonvolatile memory device according to another embodiment of the present invention to recover from the "held HR state."

As illustrated in FIG. 14, when the resistance value Rc of the selected memory cell is greater than the reference resistance RL for LR writing verify (Rc>RL) as a result of the determination in the first determination step (No in S2), the control circuit 210 determines that the "held HR state" is occurring and enters the LR writing recovery operation.

In the LR writing recovery operation, the control circuit 210, as the preliminary recovery step, first applies the first preliminary recovery-voltage pulse (for example, the first functional recovery-voltage pulse (voltage is Vrch)) to the selected memory cell (S3), next, applies the second preliminary recovery-voltage pulse (for example, the second functional recovery-voltage pulse (voltage is −Vrcl)) to the selected memory cell (S4), and performs the LR writing verify-read again (S2). Such a process (the application of the set of preliminary recovery voltage pulses) is repeated until it is verified that the resistance state has successfully changed to the low resistance (LR) state (Yes in S2), or for a predetermined upper limit number of times (No in S5).

When the above-mentioned process is repeated the predetermined upper limit number of times without success in changing the resistance state to the low resistance (LR) state (Yes in S5), subsequently, the control circuit 210, as the strong recovery step, applies the first strong recovery-voltage pulse (voltage is Vrch3) (S8) and applies the second strong recovery-voltage pulse (voltage is −Vrcl3, the pulse width is TpL (0)) (S9) for the LR writing recovery, and performs the LR writing verify-read again as the second determination step (S2). Such a process (the application of the set of strong recovery-voltage pulses) is repeated (No in S10) until it can be verified that the resistance state has successfully changed to the low resistance (LR) state (Yes in S2), or for the predetermined upper limit number of times at the pulse width TpL (0) (Yes in S10). When the above-mentioned process is repeated the predetermined upper limit number of times without success in changing the resistance state to the low resistance (LR) state (Yes in S10), the control circuit 210 increments m by +1 (S11) to increase the pulse width of the second strong recovery-voltage pulse to TpL (1) (>TpL (0)), and applies the first strong recovery-voltage pulse (voltage is Vrch3) (S8) and applies the second strong recovery-voltage pulse (voltage is −Vrcl3, the pulse width is TpL (1)) (S9) for the LR writing recovery again, and performs the LR writing verify-read (S2). Such a process is repeated, increasing the pulse width TpL (m) of the second strong recovery-voltage, until it is verified that the resistance state has successfully changed to the LR state in the second determination step (Yes in S2).

The upper limit number of times steps S5 and S10 are repeated may be once, as appropriate.

Here, step S9 corresponds to the timing diagram illustrated in (b) of FIG. 12 (tl=TpL (m)).

Thus, the strong "held HR state" can be eliminated as well by the LR writing recovery operation (the preliminary recovery step and the strong recovery step) from the "held HR state" according to the variation. Thus, the resistance change operation of the memory cell array stabilizes significantly, allowing for further increased number of write times.

Preferably, the initial pulse width TpL (0) of the second strong recovery-voltage pulse 21 is greater than the pulse width of the normal LR writing voltage pulse 11 (voltage is −VL). Thus, when the pulse width of the normal LR writing voltage pulse 11 (voltage is −VL) is, for example, 100 ns, the pulse width of the second strong recovery-voltage pulse 21 is set to, preferably, TpL (0)=500 ns, TpL (1)=1 µs, TpL (2)=5 µs, TpL (3)=10 µs, TpL (4)=50 µs, TpL (5)=100 µs, and so on.

Moreover, if the selected memory cell does not show the LR writing recovery even by the LR writing recovery operation illustrated in FIG. 14, the memory cell may be determined irrecoverable, and known alternatives (such as, redundancy and error correction) may be performed.

In the LR writing recovery operation illustrated in FIG. 14, for purposes of reducing the write time period, the application of the set of preliminary recovery voltage pulses (steps S3, S4, and S5) may be eliminated as appropriate. In other words, for the recovery from the "held HR state", the preliminary recovery step may be skipped and the strong recovery step may be executed.

Alternatively, as the application of the set of preliminary recovery voltage pulses (steps S3, S4, and S5), the set of re-breakdown voltage pulses may be applied instead of the set of functional recovery-voltage pulses. In this case, the first re-breakdown voltage pulse is applied as the first preliminary recovery-voltage pulse in step S3 of FIG. 14, and the second re-breakdown voltage pulse is applied as the second preliminary recovery-voltage pulse in step S4 of FIG. 14.

Moreover, while the configuration of the memory device shown in FIG. 8 employs, the so-called 1T1R memory cell in which one variable resistance element is connected to the NMOS transistor which is the switching element, the present invention is not limited to the 1T1R memory cell. For example, a 1D1R memory cell which includes a bidirectional diode may be applied as the switching element.

The present invention has been described with respect to the LR writing recovery operation when the "held HR state" has occurred. However, when the "held low resistance (LR) state" which is the reversed phenomenon occurs, the order of applying the first strong recovery-voltage pulse (HR writing) and the second strong recovery-voltage pulse (LR writing) may be inverted (i.e., the polarities of the voltage pulses are reversed), as appropriate, and the operational flow of the HR writing recovery from the held LR state may be incorporated in the HR writing operation, as with the LR writing recovery operation. Moreover, even in such a HR writing recovery operation from a "held LR state", control may be performed by sequentially increasing the pulse width of the second strong recovery-voltage pulse (HR writing) which follows the first strong recovery-voltage pulse (LR writing) so that HR writing recovery from a strong "held LR state" can be achieved. It should be noted that the "held low resistance (LR) state" is the reversed phenomenon of the "held high resistance (HR) state", wherein the resistance state of the variable resistance element does not change to the high resistance (HR) state (maintained in the LR state) even if the HR writing voltage pulse is applied to the variable resistance element in the LR state.

Various modifications to the embodiments that may be conceived by those skilled in the art and a write method for writing to a variable resistance nonvolatile memory element obtained by any combination of the components included in each of the embodiments are included in the present invention, without departing from the spirit of the present invention.

INDUSTRIAL APPLICABILITY

The present invention is applicable as a trusted memory for use in electronic devices such as mobile phones and note PCs because, as a variable resistance nonvolatile memory device and a write method for writing to a variable resistance nonvolatile memory element, the present invention can perform write operation in a practical range of voltage and increase the number of write times in, particularly, a variable resistance nonvolatile memory device that includes a memory cell which includes a variable resistance element the resistance value of which reversibly changes based on an electric signal, and a switching element such as a transistor.

REFERENCE SIGNS LIST 1, 2 Electrode
3 Conductor film
4 Insulator film
5 Variable resistance element
10 High resistance (HR) writing voltage pulse
11 Low resistance (LR) writing voltage pulse
12 First re-breakdown voltage pulse
13 Second re-breakdown voltage pulse
14 First functional recovery-voltage pulse
15 Second functional recovery-voltage pulse
16 First functional recovery-voltage pulse (under-voltage)
19 Set of strong recovery-voltage pulses
20 First strong recovery-voltage pulse
21 Second strong recovery-voltage pulse
100 Variable resistance element (variable resistance nonvolatile memory element)
100$a$ Bottom electrode
100$b$ Variable resistance layer
100$b$-1 First transition metal oxide layer
100$b$-2 Second transition metal oxide layer
100$c$ Top electrode
101, 105 Bottom electrode terminal
102 Top electrode terminal
103 Gate terminal
104 NMOS transistor
110, 111, 112, 113 Filament
200 (variable resistance) Nonvolatile memory device
201 Memory main portion
202 Memory cell array
203 Column selection circuit
204 Sense amplifier
205 Data input/output circuit
206 Write circuit
207 Row driver
208 Row selection circuit
209 Address input circuit
210 Control circuit
211 Write power source
212 Power source for low resistance (LR) writing
213 Power source for high resistance (HR) writing
218 Current mirror circuit
219, 220 Clamping transistor
221 Reference circuit
222, 223 Selection transistor
224 Differential amplifier
225, 226 Transistor
702 Reference current generating circuit for normal operation
703 Reference current generating circuit for LR writing verify

The invention claimed is:

1. A write method for writing to a variable resistance nonvolatile memory element for reversibly changing a resistance state of the variable resistance nonvolatile memory element by applying a voltage pulse to the variable resistance nonvolatile memory element, the variable resistance nonvolatile memory element including a first electrode, a second electrode, and a variable resistance layer between the first electrode and the second electrode, the variable resistance layer including a first transition metal oxide layer in contact with the first electrode, and a second transition metal oxide layer in contact with the second electrode, the second transition metal oxide layer having a smaller oxygen deficiency than the first transition metal oxide layer, the variable resistance nonvolatile memory element having characteristics of changing the resistance state from a first resistance state for use in recording first information to a second resistance state for use in recording second information when a pulse of a first voltage is applied to the variable resistance nonvolatile memory element, and changing the resistance state from the second resistance state to the first resistance state when a pulse of a second voltage that has a polarity different from the first voltage is applied to the variable resistance nonvolatile memory element, the write method comprising:

(a) determining whether the resistance state of the variable resistance nonvolatile memory element fails to change to the second resistance state, remaining in the first resistance state when the pulse of the first voltage is applied to the variable resistance nonvolatile memory element; and (b) applying a set of strong recovery-voltage pulses at least once to the variable resistance nonvolatile memory element when it is determined in step (a) that the resistance state of the variable resistance nonvolatile memory element fails to change to the second resistance state, remaining in the first resistance state, the set of strong recovery-voltage pulses including two pulses which are: a first strong recovery-voltage pulse having a greater amplitude than the second voltage and a same polarity as the second voltage; and a second strong recovery-voltage pulse which follows the first strong recovery-voltage pulse and has a longer pulse width than a pulse width of the first voltage and a same polarity as the first voltage.

2. The write method for writing to the variable resistance nonvolatile memory element according to claim 1, further comprising (c) applying, prior to step (b), a set of preliminary recovery voltage pulses at least once to the variable resistance nonvolatile memory element when it is determined in step (a) that the resistance state of the variable resistance nonvolatile memory element fails to change to the second resistance state, remaining in the first resistance state, the set of preliminary recovery voltage pulses including two pulses which are: a first preliminary recovery-voltage pulse having a greater first preliminary amplitude than the second voltage and a same polarity as the second voltage; and a second preliminary recovery-voltage pulse which follows the first preliminary recovery-voltage pulse and has a same polarity as the first voltage, wherein the set of strong recovery-voltage pulses is applied at least once to the variable resistance nonvolatile memory element in step (b) when the resistance state of the variable resistance nonvolatile memory element fails to change to the second resistance state after step (c).

3. The write method for writing to the variable resistance nonvolatile memory element according to claim 2, wherein the first preliminary recovery-voltage pulse and the first strong recovery-voltage pulse are equal in amplitude.

4. The write method for writing to the variable resistance nonvolatile memory element according to claim 1, further comprising (d) determining whether the resistance state of the variable resistance nonvolatile memory element has changed to the second resistance state by the application of the second strong recovery-voltage pulse, wherein step (b) and step (d) are repeated until the resistance state of the variable resistance nonvolatile memory element reaches the second resistance state.

5. The write method for writing to the variable resistance nonvolatile memory element according to claim 4, wherein when the resistance state of the variable resistance nonvolatile memory element does not change to the second resistance state after step (b) and step (d) are repeated a predetermined first number of times, the second strong recovery-voltage pulse is changed to a new second strong recovery-voltage pulse that has a longer pulse width than the second strong recovery-voltage pulse, and step (b) and step (d) are repeated a predetermined second number of times.

6. The write method for writing to the variable resistance nonvolatile memory element according to claim 1, wherein the first transition metal oxide layer comprises a first composition represented by $TaO_x$, and the second transition metal oxide layer comprises a second composition represented by $TaO_y$, where x<y.

7. The write method for writing to the variable resistance nonvolatile memory element according to claim 1, wherein the variable resistance nonvolatile memory element is an element, a resistance state of which reversibly changes between a high resistance state and a low resistance state, the high resistance state being the first resistance state, the low resistance state being the second resistance state.

8. A variable resistance nonvolatile memory device comprising:

a memory cell in which a variable resistance nonvolatile memory element and a switching element are connected in series; and a drive circuit for driving the memory cell, the variable resistance nonvolatile memory element including a first electrode, a second electrode, and a variable resistance layer between the first electrode and the second electrode, the variable resistance layer including a first transition metal oxide layer in contact with the first electrode, and a second transition metal oxide layer in contact with the second electrode, the second transition metal oxide layer having a smaller oxygen deficiency than the first transition metal oxide layer, the variable resistance nonvolatile memory element having characteristics of changing a resistance state from a first resistance state for use in recording first information to a second resistance state for use in recording second information when a pulse of a first voltage is applied to the variable resistance nonvolatile memory element, and changing the resistance state from the second resistance state to the first resistance state when a pulse of a second voltage having a polarity different from the first voltage is applied to the variable resistance nonvolatile memory element, the drive circuit including:

a write circuit for writing to the memory cell;

a sense amplifier for reading from the memory cell; and a control circuit for executing, using the sense amplifier, (a) determining whether the resistance state of the variable resistance nonvolatile memory element fails to change to the second resistance state, remaining in the first resistance state when the write circuit applies the pulse of the first voltage to the variable resistance nonvolatile memory element, wherein when it is determined in step (a) that the resistance state of the variable resistance nonvolatile memory element fails to change to the second resistance state, remaining in the first resistance state, the control circuit controls the write circuit to execute (b) applying a set of strong recovery-voltage pulses at least once to the variable resistance nonvolatile memory element, the set of strong recovery-voltage pulses including two pulses which are: a first strong recovery-voltage pulse having a greater amplitude than the second voltage and a same polarity as the second voltage; and a second strong recovery-voltage pulse which follows the first strong recovery-voltage pulse, and has a longer pulse width than a pulse width of the first voltage and a same polarity as the first voltage.

9. The variable resistance nonvolatile memory device according to claim 8,
wherein when it is determined in step (a) that the resistance state of the variable resistance nonvolatile memory element fails to change to the second resistance state, remaining in the first resistance state, the control circuit further controls the write circuit to execute, prior to step (b), (c) applying a set of preliminary recovery voltage pulses at least once to the variable resistance nonvolatile memory element, the set of preliminary recovery voltage pulses including two pulses which are: a first preliminary recovery-voltage pulse having a greater first preliminary amplitude than the second voltage and a same polarity as the second voltage; and a second preliminary recovery-voltage pulse which follows the first preliminary recovery-voltage pulse and has a same polarity as the first voltage, and
the control circuit controls the write circuit to execute step (b) when the resistance state of the variable resistance nonvolatile memory element fails to change to the second resistance state after step (c).

10. The variable resistance nonvolatile memory device according to claim 9,
wherein the first preliminary recovery-voltage pulse and the first strong recovery-voltage pulse are equal in amplitude.

11. The variable resistance nonvolatile memory device according to claim 8,
wherein the control circuit further executes, using the sense amplifier, (d) determining whether the resistance state of the variable resistance nonvolatile memory element has changed to the second resistance state by the application of the second strong recovery-voltage pulse, and
the control circuit controls the write circuit and the sense amplifier so that step (b) and step (d) are repeated until the resistance state of the variable resistance nonvolatile memory element reaches the second resistance state.

12. The variable resistance nonvolatile memory device according to claim 11,
wherein when the resistance state of the variable resistance nonvolatile memory element does not change to the second resistance state after step (b) and step (d) are repeated a predetermined first number of times, the control circuit controls the write circuit and the sense amplifier so that the second strong recovery-voltage pulse is changed to a new second strong recovery-voltage pulse that has a longer pulse width than the second strong recovery-voltage pulse and step (b) and step (d) are repeated a predetermined second number of times.

13. The variable resistance nonvolatile memory device according to claim 8,
wherein the first transition metal oxide layer comprises a first composition represented by $TaO_x$, and
the second transition metal oxide layer comprises a second composition represented by $TaO_y$, where $x<y$.

14. The variable resistance nonvolatile memory device according to claim 8,
wherein the switching element is an MOS transistor.

15. The variable resistance nonvolatile memory device according to claim 8,
wherein the switching element is a bidirectional diode.

16. The variable resistance nonvolatile memory device according to claim 8,
wherein the variable resistance nonvolatile memory element is an element, a resistance state of which reversibly changes between a high resistance state and a low resistance state, the high resistance state being the first resistance state, the low resistance state being the second resistance state.

\* \* \* \* \*